(12) United States Patent
Park et al.

(10) Patent No.: US 9,811,928 B2
(45) Date of Patent: Nov. 7, 2017

(54) METHOD AND APPARATUS FOR DISPLAYING PULSE SEQUENCE OF MAGNETIC RESONANCE IMAGING APPARATUS

(71) Applicant: SAMSUNG ELECTRONICS CO., LTD., Suwon-si (KR)

(72) Inventors: Sung-hun Park, Seoul (KR); Sang-young Zho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 14/824,477

(22) Filed: Aug. 12, 2015

(65) Prior Publication Data
US 2016/0048986 A1    Feb. 18, 2016

(30) Foreign Application Priority Data
Aug. 13, 2014    (KR) .......................... 10-2014-0105433

(51) Int. Cl.
| | |
|---|---|
| *G06T 11/20* | (2006.01) |
| *G01R 33/28* | (2006.01) |
| *G06T 11/00* | (2006.01) |
| *G01R 33/54* | (2006.01) |

(52) U.S. Cl.
CPC .......... *G06T 11/206* (2013.01); *G01R 33/283* (2013.01); *G01R 33/546* (2013.01); *G06T 11/001* (2013.01); *G06T 2210/41* (2013.01)

(58) Field of Classification Search
CPC ...... G06T 11/206; G01R 33/546; G01R 1/025
See application file for complete search history.

(56) References Cited

U.S. PATENT DOCUMENTS

| | | | |
|---|---|---|---|
| 5,247,438 A | 9/1993 | Subas et al. | |
| 6,320,577 B1* | 11/2001 | Alexander | G01R 13/02 345/440 |
| 6,801,037 B1 | 10/2004 | Zhang | |
| 7,081,750 B1 | 7/2006 | Zhang | |
| 2002/0077781 A1 | 6/2002 | Liebl et al. | |
| 2008/0009705 A1 | 1/2008 | Furudate | |
| 2012/0182301 A1 | 7/2012 | Wenholz et al. | |

(Continued)

FOREIGN PATENT DOCUMENTS

JP        3-37044 A        2/1991

OTHER PUBLICATIONS

Communication dated Nov. 18, 2015 by the International Searching Authority in related Application No. PCT/KR2015/008423, (PCT/ISA/220, PCT/ISA/210, & PCT/ISA/237).

(Continued)

*Primary Examiner* — Jeffery A Brier
(74) *Attorney, Agent, or Firm* — Sughrue Mion, PLLC

(57) ABSTRACT

A pulse display apparatus includes a display configured to display a pulse sequence schematic diagram that shows an MRI pulse sequence along a timeline that is divided into a plurality of time sections, a user input unit configured to receive a user input for selecting a first point on the pulse sequence schematic diagram, and a controller configured to control the display such that an image that is usable for identifying a first area is displayed on the first area, wherein the first point is located in the first area from among a plurality of areas that correspond to the plurality of time sections.

21 Claims, 15 Drawing Sheets

(56) References Cited

U.S. PATENT DOCUMENTS

| | | |
|---|---|---|
| 2013/0023753 A1 | 1/2013 | Kawamura et al. |
| 2013/0085403 A1 | 4/2013 | Gunderson et al. |
| 2014/0022256 A1* | 1/2014 | Carnes ................. G06T 11/206 |
| | | 345/440.1 |

OTHER PUBLICATIONS

Communication dated Jan. 20, 2016, from the European Patent Office in counterpart European Application No. 15180901.9.
Shen Jie et al., "A powerful graphical pulse sequence programming tool for magnetic resonance imaging", Magnetic Resonance Materials in Physics, Biology and Medicine, Chapman and Hall, London, GB, vol. 18, MAGMA, (2005) pp. 332-342, XP019358232 DOI 10.1007/s10334-005-0021-z.

* cited by examiner

FIG. 3A

```
S300 → PulseSequenceTimeLine psTimeLine = new PulseSequenceTimeLine();
       // creates one sequence block ("block1 text")
       {
S310     PulseSequence seqBlock1 = new PulseSequence("block1 text");          ←S312
         seqBlock1.setAllDurationNanos(1000 * 1000 * 5); // set duration to 5 ms  ←S313
         seqBlock1.setUIColor(Color.BLUE);    ←S314
         // add RF pulse
         RfSincPulseShape rfPulse = new RfSincPulseShape("rf_sinc_1");   ←S315
         rfPulse.setDurationMillis(3);    ←S316
         seqBlock1.addPulseShapeAtNanos(PulseSequence.RF_TIMELINE, rfPulse, 100);   ←S317
         // add to global timeline
         psTimeLine.addPulseSequenceAtNanos(seqBlock1, 0);   ←S318
       }
       // creates another sequence block ("block2 text")
       {
S320     PulseSequence seqBlock2 = new PulseSequence("block2 text");   ←S321
         seqBlock2.setAllDurationNanos(1000 * 1000 * 10); // set duration to 10 ms   ←S322
         seqBlock2.setUIColor(Color.RED);   ←S323
         GradTrapPulseShape gradientPulse = new GradTrapPulseShape("gradient_trapezoid_pulse_1");   ←S324
         gradientPulse.setFlatTopTimeInNanos(1000);   ←S325
         gradientPulse.setRampTimesInNanos(1000);   ←S326
         gradientPulse.setAmplitude(30);
         seqBlock2.addPulseShapeAtNanos(PulseSequence.GX_TIMELINE, gradientPulse, 100);   ←S328
         // add to global timeline
         psTimeLine.appendPulseSequence(seqBlock2);   ←S329
       }
```

METHOD AND APPARATUS FOR DISPLAYING PULSE SEQUENCE OF MAGNETIC RESONANCE IMAGING APPARATUS

CROSS-REFERENCE TO RELATED APPLICATION

This application claims priority from Korean Patent Application No. 10-2014-0105433, filed on Aug. 13, 2014, in the Korean Intellectual Property Office, the disclosure of which is incorporated herein by reference in its entirety.

BACKGROUND

1. Field

One or more exemplary embodiments relate to a method and apparatus for displaying a pulse sequence of a magnetic resonance imaging apparatus.

2. Description of the Related Art

A magnetic resonance imaging (MRI) system is an apparatus that is configured for acquiring a sectional image of a part of an object by expressing, in a contrast comparison, a strength of an MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object, which has been placed in a strong magnetic field, and then such emission stops, an MR signal is emitted from the specific atomic nucleus, and thus the MRI system may receive the MR signal and acquire an MR image.

In general, a plurality of RF pulses and a plurality of gradient pulses are sequentially applied to an object for a relatively long time in order to acquire an MR image of the object. Such series of RF pulses and gradient pulses may be referred to as an MRI pulse sequence.

Further, the MRI pulse sequence may be set by a user. The MRI pulse sequence that is set by the user may be displayed as a pulse sequence schematic diagram.

SUMMARY

One or more exemplary embodiments include a method and apparatus for manipulating a pulse sequence schematic diagram according to area units and displaying the pulse sequence schematic diagram.

Additional aspects will be set forth in part in the description which follows and, in part, will be apparent from the description, or may be learned by practice of the presented exemplary embodiments.

According to one or more exemplary embodiments, a pulse display apparatus includes a display configured to display a pulse sequence schematic diagram that shows a magnetic resonance imaging (MRI) pulse sequence along a timeline that is divided into a plurality of time sections, a user input device configured to receive a user input that relates to selecting a first point on the pulse sequence schematic diagram, and a controller configured to control the display such that an image that is usable for identifying a first area is displayed on the first area. The first point is located in the first area from among a plurality of areas that correspond to the plurality of time sections.

The controller may be further configured to acquire a parameter setting value that is usable for determining the plurality of time sections and MRI pulses generated in the plurality of time sections, and based on the parameter setting value, may be further configured to generate the MRI pulse sequence. The display may be further configured to display the MRI pulse sequence along the timeline.

The parameter setting value may include at least one selected from among time length information that relates to the plurality of time sections, order information that relates to the plurality of time sections, information about respective colors that correspond to the plurality of time sections, and information about the MRI pulses generated in the plurality of time sections.

The display may be further configured to display a division line for dividing the plurality of time sections, on the pulse sequence schematic diagram.

The controller may extract respective colors that correspond to the plurality of areas based on the information about the respective colors that correspond to the plurality of time sections. The display may be further configured to display the extracted respective colors on the plurality of areas.

The user input device may be further configured to receive a user input that relates to changing a time scale of the timeline. When the user input that relates to changing the time scale is received, the display may be further configured to adjust respective sizes of the plurality of areas that correspond to the plurality of time sections and to display the extracted respective colors with the adjusted sizes.

The MRI pulse sequence may include a plurality of pulse sequences. The controller may be further configured to determine a pulse sequence that corresponds to the first point from among the plurality of pulse sequences, and to determine a second area that corresponds to the determined pulse sequence from the first area. The display may be further configured to display an image that is usable for identifying the second area on the second area.

The user input device may be further configured to receive a user input that relates to dragging from the first point in a direction of the timeline of the pulse sequence schematic diagram. Based on the user input that relates to the dragging, the controller may be further configured determine at least two areas that include at least a part of the first area where the first point is located. The display may be further configured to display a respective image that is usable for identifying a corresponding one of the at least two areas on each of the at least two areas.

The display may be further configured to display information about an MRI pulse displayed in the first area from among a plurality of MRI pulses that form the MRI pulse sequence.

When the image that is usable for identifying the first area is displayed, the display may be further configured to display an input window that relates to inputting annotation information. The user input device may be further configured to receive a user input that relates to inputting annotation information that describes the first area, via the input window. The controller may be further configured to map the inputted annotation information to a time section that corresponds to the first area from among the plurality of time sections, and then to store the mapped annotation information.

According to one or more exemplary embodiments, a pulse sequence display method includes displaying a pulse sequence schematic diagram that shows an MRI pulse sequence along a timeline that is divided into a plurality of time sections, receiving a user input that relates to selecting a first point on the pulse sequence schematic diagram, and controlling the display such that an image that is usable for identifying a first area is displayed on the first area. The first point is located in the first area from among a plurality of areas that correspond to the plurality of time sections.

The displaying the pulse sequence schematic diagram may include acquiring a parameter setting value that is usable for determining the plurality of time sections and MRI pulses generated in the plurality of time sections, generating, based on the parameter setting value, the MRI pulse sequence, and displaying the MRI pulse sequence along the timeline. The parameter setting value may include at least one from among time length information that relates to the plurality of time sections, order information that relates to the plurality of time sections, information about respective colors that correspond to the plurality of time sections, and information about the MRI pulses generated in the plurality of time sections.

The displaying the pulse sequence schematic diagram may include displaying a division line for dividing the plurality of time sections on the pulse sequence schematic diagram.

The method may further include extracting respective colors that correspond to the plurality of areas based on the information about the respective colors that correspond to the plurality of time sections, and displaying the extracted respective colors on the plurality of areas.

The displaying the extracted respective colors on the plurality of areas may include receiving a user input that relates to changing a time scale of the timeline, adjusting respective sizes of the plurality of areas that correspond to the plurality of time sections, and displaying the extracted respective colors with the adjusted sizes.

The MRI pulse sequence may include a plurality of pulse sequences. The displaying the image that is usable for identifying the first area may include determining a pulse sequence that corresponds to the first point from among the plurality of pulse sequences, determining a second area that corresponds to the determined pulse sequence from the first area, and displaying an image that is usable for identifying the second area on the second area.

The method may further include receiving a user input that relates to dragging from the first point in a direction of the timeline of the pulse sequence schematic diagram, determining, based on the user input that relates to the dragging, at least two areas that include at least a part of the first area where the first point is located, and displaying a respective image that is usable for identifying a corresponding one of the at least two areas on each of the at least two areas.

The method may further include displaying information about an MRI pulse displayed in the first area from among a plurality of MRI pulses that form the MRI pulse sequence.

The method may further include displaying, when the image that is usable for identifying the first area is displayed, an input window that relates to inputting annotation information, receiving, via the input window, a user input that relates to inputting annotation information that describes the first area, and mapping the inputted annotation information to a time section that corresponds to the first area from among the plurality of time sections, and then storing the mapped annotation information.

According to one or more exemplary embodiments, a display apparatus for use in conjunction with a magnetic resonance imaging (MRI) apparatus includes a display configured to display a sequence of pulses received from the MRI apparatus in conjunction with a reference timeline, each respective pulse from among the sequence of pulses corresponding to a respective function associated with the MRI apparatus; a user input device configured to receive a user input that relates to manipulating the display of the sequence of pulses; and a controller configured to control the display based on the received user input.

The controller may be further configured to control the display to display a user interface (UI) window that is configured to facilitate a reception of user input via the user input device by prompting a user to provide a user input that relates to a predetermined function.

The user input device may further configured to receive a user input that relates to at least one from among a display parameter that is usable for arranging the display of the sequence of pulses, a time scale parameter that relates to changing a time scale of the reference timeline, a dragging input that relates to dragging at least one pulse from among the sequence of pulses, and an annotation input that relates to textual information with respect to at least one pulse from among the sequence of pulses.

When the received user input includes the display parameter, and when the display parameter includes information that relates to respective colors that correspond to the sequence of pulses, the controller may be further configured to control the display to display the respective colors in correspondence with the display of the sequence of pulses.

When the received user input includes the time scale parameter, the controller may be further configured to control the display to adjust a respective size of each pulse from among the sequence of pulses based on the time scale parameter.

According to one or more exemplary embodiments, a method for displaying information generated by a magnetic resonance imaging (MRI) apparatus, includes displaying, on a display, a sequence of pulses received from the MRI apparatus in conjunction with a reference timeline, each respective pulse from among the sequence of pulses corresponding to a respective function associated with the MRI apparatus; receiving a user input that relates to manipulating the displaying of the sequence of pulses; and controlling the displaying of the sequence of pulses based on the received user input.

The method may further include displaying a user interface (UI) window that is configured to prompt a user to provide a user input that relates to a predetermined function.

The receiving a user input may include receiving a user input that relates to at least one from among a display parameter that is usable for arranging the displaying of the sequence of pulses, a time scale parameter that relates to changing a time scale of the reference timeline, a dragging input that relates to dragging at least one pulse from among the sequence of pulses, and an annotation input that relates to textual information with respect to at least one pulse from among the sequence of pulses.

When the received user input includes the display parameter, and when the display parameter includes information that relates to respective colors that correspond to the sequence of pulses, the displaying the sequence of pulses further may include displaying the respective colors in correspondence with the sequence of pulses.

When the received user input includes the time scale parameter, the displaying the sequence of pulses may further include adjusting a respective size of each pulse from among the sequence of pulses based on the time scale parameter.

BRIEF DESCRIPTION OF THE DRAWINGS

These and/or other aspects will become apparent and more readily appreciated from the following description of exemplary embodiments, taken in conjunction with the accompanying drawings in which:

FIGS. 3A and 3B are diagrams of a method for displaying a pulse sequence schematic diagram based on a parameter setting value for determining an MRI pulse sequence, according to an exemplary embodiment;

DETAILED DESCRIPTION

Figure 1:
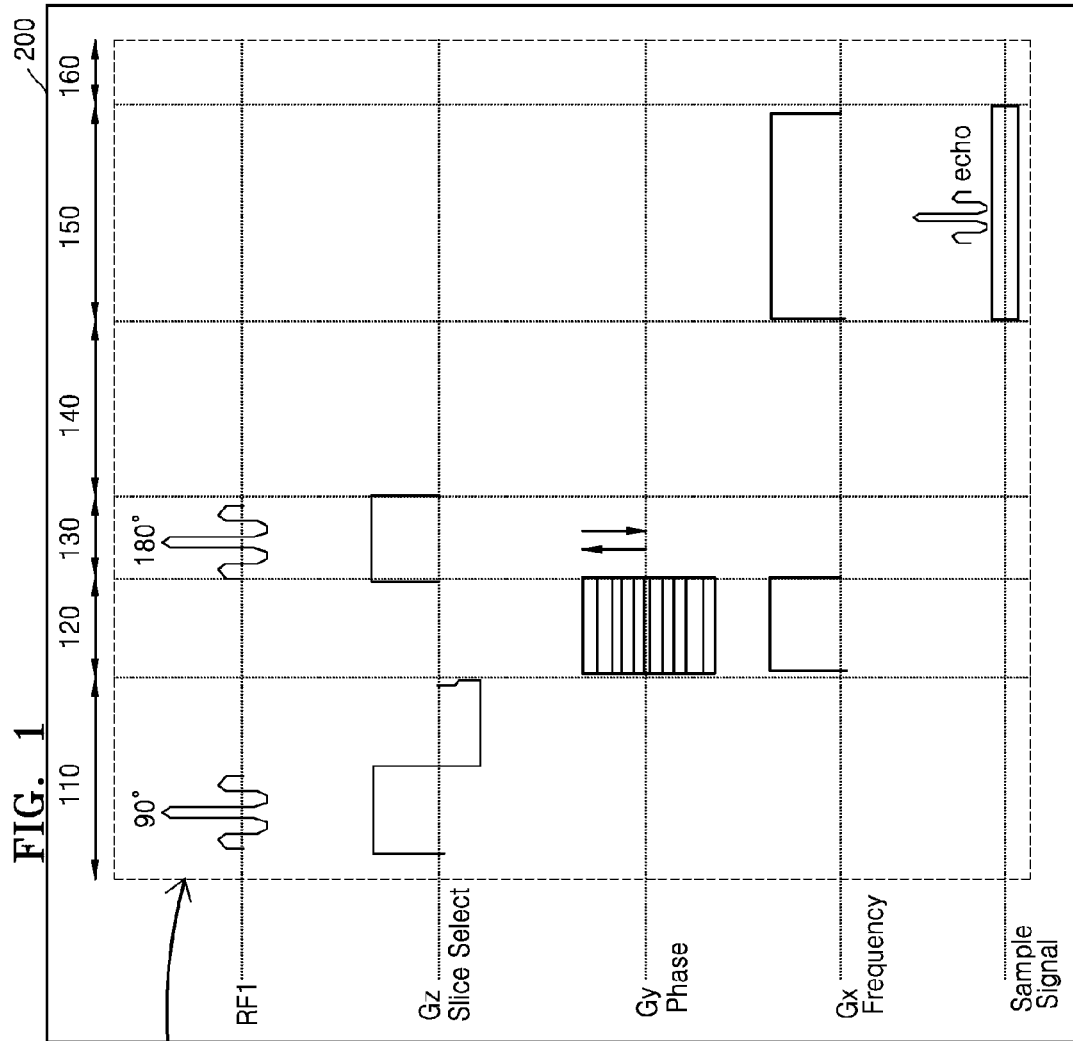
FIG. 1 is a diagram of a method for displaying a magnetic resonance imaging (MRI) pulse sequence, performed by a pulse display apparatus, according to an exemplary embodiment.
Figure 1:
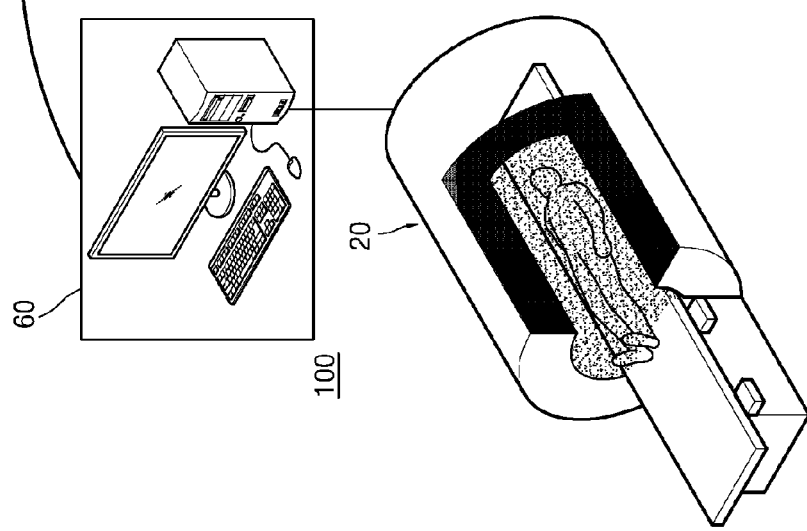

Terms used herein will now be briefly described and then one or more exemplary embodiments will be described in detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description. Thus, the terms used herein have to be defined based on the meaning of the terms together with the description throughout the specification. Expressions such as "at least one of," when preceding a list of elements, modify the entire list of elements and do not modify the individual elements of the list.

It will be further understood that the terms "comprises" and/or "comprising" used herein specify the presence of stated features or components, but do not preclude the presence or addition of one or more other features or components. In addition, the terms such as "unit," "-er(-or)," and "module" described in the specification refer to an element that is configured for performing at least one function or operation, and may be implemented in hardware, software, or the combination of hardware and software.

Reference will now be made in detail to exemplary embodiments, examples of which are illustrated in the accompanying drawings. In this regard, the present exemplary embodiments may have different forms and should not be construed as being limited to the descriptions set forth herein. In the following description, well-known functions or constructions are not described in detail so as not to obscure the exemplary embodiments with unnecessary detail. Like reference numerals in the drawings denote like elements.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object that is obtained by using the nuclear magnetic resonance principle.

Furthermore, in the present specification, an "MRI pulse sequence" refers to continuity of signals repeatedly applied by an MRI apparatus. The MRI pulse may include any of a radio frequency (RF) pulse, a gradient pulse, and an analog-to-digital converter (ADC) pulse. Therefore, the MRI pulse sequence may include an RF pulse sequence, a gradient pulse sequence, and an ADC pulse sequence.

Furthermore, in the present specification, a "pulse sequence schematic diagram" shows an order of events that occur in an MRI apparatus. For example, the pulse sequence schematic diagram may include any of a diagram showing an RF pulse, a gradient magnetic field, an MR signal, or the like according to time.

FIG. 1 is a diagram of a method for displaying an MRI pulse sequence, performed by a pulse display apparatus 100, according to an exemplary embodiment.

Referring to FIG. 1, the pulse display apparatus 100 may be an MRI apparatus. The pulse display apparatus 100 may include a gantry 20 and an operating unit (also referred to herein as a "user workstation") 60.

The pulse display apparatus 100 may receive, via the operating unit 60, a user input that relates to setting an MRI pulse sequence to be applied to an object. The pulse display apparatus 100 may generate an MRI pulse according to the set MRI pulse sequence, and apply the generated MRI pulse to the object in the gantry 20.

The MRI pulse sequence may include, for example, one RF pulse sequence, three gradient pulse sequences, and an ADC pulse sequence.

An RF pulse sequence may indicate information about a series of RF pulses to be applied to the object. The information about the series of RF pulses may include information about any one or more of a shape, an amplitude, and a duration of the series of RF pulses, and a time point at which the series of RF pulses are applied to the object.

Further, a gradient pulse sequence may indicate information about a series of gradient pulses. The information about the series of gradient pulses may include any one or more of a shape, a maximum amplitude, and a duration of the series of gradient pulses, an axis to which a gradient magnetic field is to be applied, a through rate (e.g., a data throughput rate), and a time point at which a gradient magnetic field is applied on the object. The three gradient pulse sequences may respectively correspond to an X-axis, a Y-axis, and a Z-axis in the gantry 20.

In addition, an ADC pulse sequence may indicate information related to at least one time of receiving RF echo data that is emitted from the object.

Still further, the pulse display apparatus 100 may display the MRI pulse sequence as a pulse sequence schematic diagram 200. For example, as shown in FIG. 1, according to generation time, the pulse display apparatus 100 may display an RF pulse sequence, X-axis, Y-axis, and Z-axis gradient pulse sequences, and an ADC sequence, which form a spin echo pulse sequence, on a timeline having an identical time scale.

The MRI pulse sequence may be divided into a plurality of time sections according to functions. For example, a first time section 110 in the spin echo pulse sequence may be a time section that corresponds to a function of exciting protons in a cross-section of an object by applying a 90° RF pulse and a cross-section selection gradient magnetic field Gz on the object.

A second time section 120 in the spin echo pulse sequence may be a time section that corresponds to a function of determining a pixel value in the cross-section of the object by increasing or decreasing one step of a phase encoding gradient magnetic field Gy in a single frequency encoding gradient magnetic field Gx.

A third time section 130 in the spin echo pulse sequence may be a time section that corresponds to a function of applying a 180° RF Pulse to refocus spins of protons which are dephased over time after the 90° RF pulse is applied.

A fourth time section 140 and a sixth time section 160 in the spin echo pulse sequence may be a time section that corresponds to a function of delaying time.

A fifth time section 150 in the spin echo pulse sequence may be a time section that corresponds to a function of receiving an echo signal from the object.

The pulse display apparatus 100 may divide an MRI pulse sequence into a plurality of time sections and display the pulse sequence schematic diagram 200 based on the divided time sections.

Figure 2:
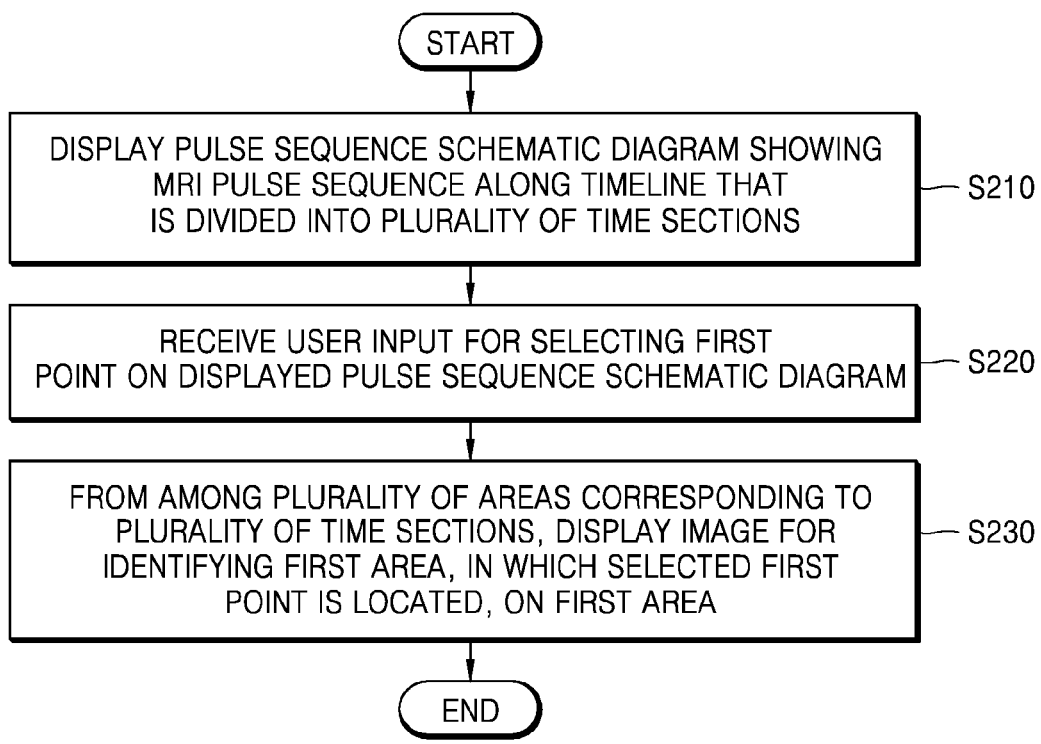
FIG. 2 is a flowchart of a method for displaying an MRI pulse sequence, performed by a pulse display apparatus, according to an exemplary embodiment.

FIG. 2 is a flowchart of a method for displaying an MRI pulse sequence, performed by the pulse display apparatus 100, according to an exemplary embodiment.

In operation S210, the pulse display apparatus 100 may display the pulse sequence schematic diagram 200 that shows an MRI pulse sequence along a timeline that is divided into a plurality of time sections.

The pulse display apparatus 100 may acquire a parameter setting value that is usable for determining the plurality of time sections and an MRI pulse generated in each of the plurality of time sections. For example, the pulse display apparatus 100 may receive a user input that relates to inputting the parameter setting value. Further, the pulse display apparatus 100 may receive a file, in which the parameter setting value that is usable for determining the MRI pulse sequence is recorded, from an external device.

The parameter setting value may include at least one selected from among time length information that relates to the plurality of time sections, order information that relates to the plurality of time sections, information about respective colors that correspond to the plurality of time sections, and information about MRI pulses generated in the plurality of time sections.

Based on the acquired parameter setting value, the pulse display apparatus 100 may generate an MRI pulse sequence that is divided into the plurality of time sections.

For example, the duration of a first time section may be determined based on a parameter setting value related to a time length of the first time section. Further, based on a parameter setting value related to an MRI pulse generated in the first time section, the pulse display apparatus 100 may determine any one or more of a shape, amplitude, duration, and generation time of the MRI pulse generated in the first time section.

When the first time section is determined, the pulse display apparatus 100 may determine a second time section that follows the first time section based on the order information of the plurality of time sections. For example, the pulse display apparatus 100 may determine the duration of the second time section based on a parameter setting value related to a time length of the second time section. Further, based on a parameter setting value related to an MRI pulse generated in the second time section, the pulse display apparatus 100 may determine any one or more of a shape, amplitude, duration, and generation time of the MRI pulse generated in the second time section.

Accordingly, based on the parameter setting value, the pulse display apparatus 100 may determine the plurality of time sections and MRI pulses generated in the determined time sections, and thus generate the MRI pulse sequence that is divided into the plurality of time sections. According to an exemplary embodiment, the pulse display apparatus 100 may receive a user input that relates to selecting a plurality of pre-stored MRI pulse sequences.

The pulse display apparatus 100 may display the generated MRI pulse sequence along the timeline of the pulse sequence schematic diagram 200.

The MRI pulse sequence may include a plurality of pulse sequences. The plurality of pulse sequences may include, for example, an RF pulse sequence, X-axis, Y-axis, and Z-axis gradient pulse sequences, and an ADC pulse sequence. The pulse display apparatus 100 may display the pulse sequence schematic diagram 200 in which the RF pulse sequence, the X-axis, Y-axis, and Z-axis gradient pulse sequences, and the ADC pulse sequence are arranged in parallel based on an identical time scale.

Further, in this case, the pulse display apparatus 100 may display only the MRI pulse sequence in the form of the pulse sequence schematic diagram 200. In addition, the pulse display apparatus 100 may display the MRI pulse sequence and a division line that divides the MRI pulse sequence into the plurality of time sections.

Alternatively, the pulse display apparatus 100 may display respective colors on each of a plurality of areas of the pulse sequence schematic diagram 200 in order to distinguish the plurality of areas.

For example, the pulse display apparatus 100 may determine a function of an MRI pulse generated in a time section of the MRI pulse sequence. When the function of the MRI pulse is determined, the pulse display apparatus 100 may display a respective image that corresponds to the determined function on a respective area that corresponds to a respective one of the plurality of time sections.

In addition, for example, based on the information about the colors that correspond to the plurality of time sections, the pulse display apparatus 100 may extract respective colors that correspond to the plurality of areas of the pulse sequence schematic diagram 200. When the colors that correspond to the plurality of areas are extracted, the pulse display apparatus 100 may display the extracted colors on the plurality of areas.

The pulse display apparatus 100 may distinguish the plurality of areas by displaying the colors on the plurality of areas of the pulse sequence schematic diagram 200 only when a user input that relates to changing a time scale of the timeline of the pulse sequence schematic diagram 200 is received. For example, when the user input that relates to changing the time scale of the timeline is received, the pulse display apparatus 100 may adjust respective sizes of the plurality of areas that correspond to the plurality of time sections of the pulse sequence schematic diagram 200, and display the extracted colors with respect to the plurality of areas with the adjusted sizes.

In operation S220, the pulse display apparatus 100 may receive a user input that relates to selecting a first point on the displayed pulse sequence schematic diagram 200.

The pulse display apparatus 100 may receive a user input that relates to touching a screen that displays the pulse sequence schematic diagram 200. Alternatively, the pulse display apparatus 100 may receive a user input that relates to selecting a first point on the pulse sequence schematic diagram 200 via a user's use of an input device such as a mouse or a keyboard.

In operation S230, from among the plurality of areas that correspond to the plurality of time sections, an image that is usable for identifying a first area, where the selected first point is located, may be displayed on the first area.

The plurality of areas in the pulse sequence schematic diagram 200 which correspond to the plurality of time sections may be determined based on the plurality of time sections and a time scale in the pulse sequence schematic diagram 200. For example, based on a time scale of a timeline, the pulse display apparatus 100 may determine locations on the timeline which correspond to the plurality of time sections of the MRI pulse sequence. Based on the locations of the plurality of time sections on the timeline, the pulse display apparatus 100 may divide the pulse sequence schematic diagram 200 into a plurality of areas.

When the plurality of areas in the pulse sequence schematic diagram 200, which correspond to the plurality of time sections, are determined, the pulse display apparatus 100 may determine an area where the selected first point is located.

For example, the pulse display apparatus 100 may determine an area that includes the selected first point as the first area, based on coordinates of the selected first point and respective locations of the plurality of areas that correspond to the plurality of time sections.

Alternatively, for example, the pulse display apparatus 100 may determine a point on the timeline which corresponds to the selected first point, based on the coordinates of the selected first point. Then, based on the locations of the plurality of time sections on the timeline, the pulse display apparatus 100 may determine a time section on the timeline which includes a point that corresponds to the selected first point from among the plurality of time sections on the timeline. Further, the pulse display apparatus 100 may determine an area that corresponds to the determined time section on the timeline as a first area where the selected first point is located.

When the first area, where the selected first point is located, is determined from among the plurality of areas in the pulse sequence schematic diagram 200, the pulse display apparatus 100 may display an image that is usable for identifying the first area on the determined first area. The image that is usable for identifying the first area may be an image that indicates that the first area was selected by the user. Further, the image that is usable for identifying the first area may include, but is not limited to, an image that represents an area with a certain color or a certain pattern.

Further, on a portion of the first area where the selected first point is located, the pulse display apparatus 100 may display an image that is usable for identifying the portion. For example, the pulse display apparatus 100 may determine a pulse sequence that corresponds to the first point from among the plurality of pulse sequences. In this aspect, from among the RF pulse sequence and the plurality of gradient pulse sequences, the pulse display apparatus 100 may determine a pulse sequence that is displayed in an area where the first point is located. When the pulse sequence, which is displayed in an area where the first point is located, is determined, the pulse display apparatus 100 may determine a second area that corresponds to the determined pulse sequence, from the first area. Further, the pulse display apparatus 100 may display an image that is usable for identifying the second area, on the second area.

Still further, the pulse display apparatus 100 may receive a user input that relates to dragging from selected first point in a direction of the timeline of the pulse sequence schematic diagram 200. When the user input that relates to dragging in the direction of the timeline is received, the pulse display apparatus 100 may determine at least two areas that include at least a part of the first area, and display a respective image that is usable for identifying a corresponding one of the at least two determined areas on each of the at least two determined areas.

In addition, the pulse display apparatus 100 may display information about an MRI pulse that is displayed on the first area from among a plurality of MRI pulses that form the MRI pulse sequence.

Further, when the image that is usable for identifying the first area is displayed, the pulse display apparatus 100 may display an input window that is usable for inputting annotation information. Through the input window, the pulse display apparatus 100 may receive a user input that relates to inputting the annotation information that explains the first area. The pulse display apparatus 100 may store the annotation information received from the user by mapping the annotation information to a time section that corresponds to the first area from among the plurality of time sections.

Figure 3B:
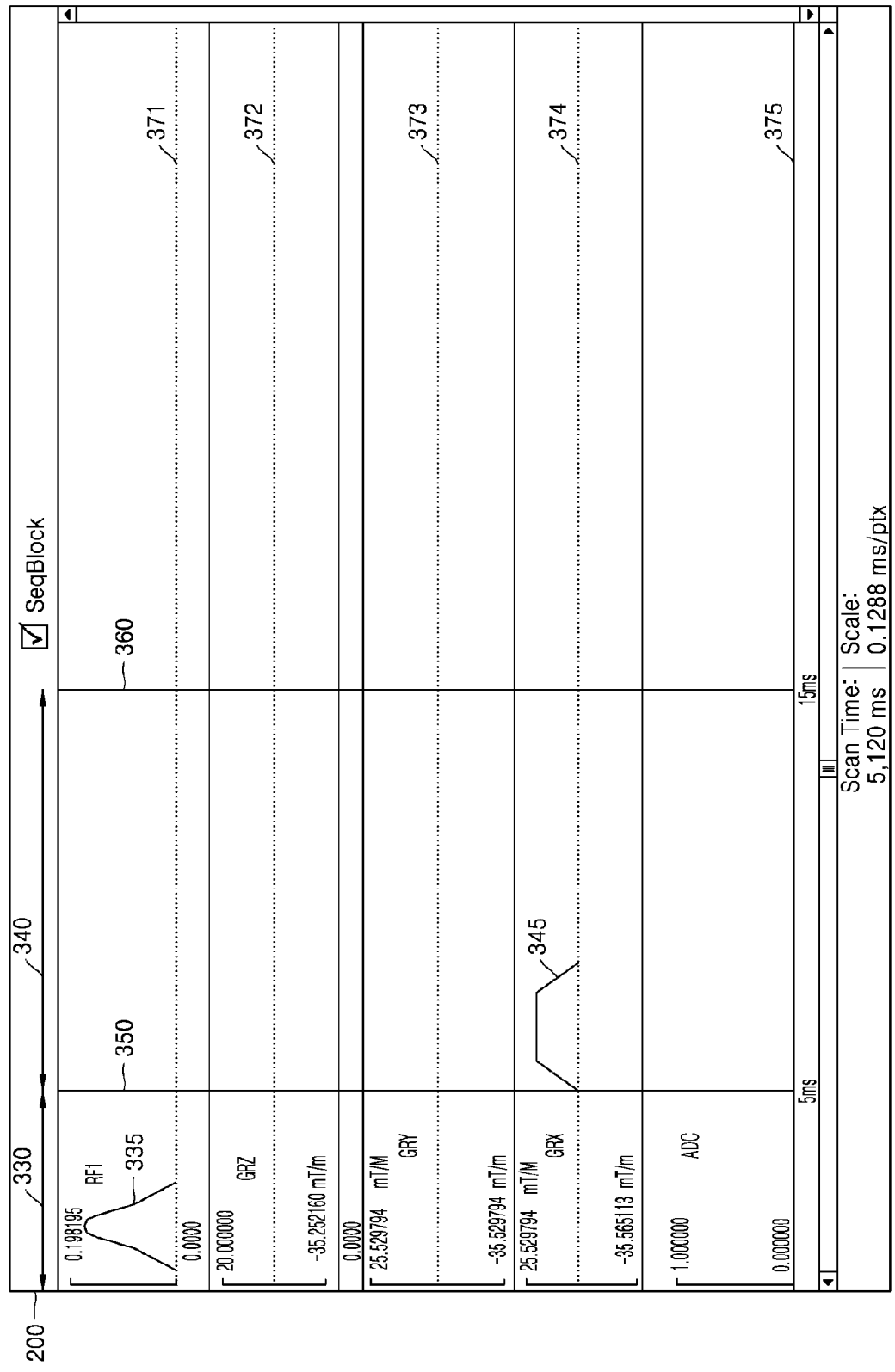

FIGS. 3A and 3B are diagrams of a method for displaying the pulse sequence schematic diagram 200 based on a parameter setting value for determining an MRI pulse sequence, according to an exemplary embodiment.

The pulse display apparatus 100 may generate an MRI pulse sequence that is divided into a plurality of time sections, based on a parameter setting value that is usable for determining the plurality of time sections of the MRI pulse sequence and an MRI pulse generated in each of the plurality of time sections.

Referring to FIG. 3A, the parameter setting value may be set in a program code format. For example, the parameter setting value may be set by using an object-oriented programming language.

Referring to operation S300, the MRI pulse sequence may be defined as an object. Referring to operations S310 and S320, a time section may also be defined as an object.

In operation S312, a time section with identification information 'block1 text' may be set. In operation S313, the duration of the time section 'block1 text' may set to 5 ms. In operation S314, blue may be set as a color that corresponds to the time section 'block1 text'. In operation S315, an RF sync pulse with identification information 'rf_sinc_1' may be set. In operation S316, the duration of the RF sync pulse 'rf_sinc_1' may set to 3 ms. In operation S317, the RF sync pulse 'rf_sinc_1' may be set as being generated in the time section 'block1 text'. In operation S318, the time section 'block1 text' may be set as a first time section of the MRI pulse sequence.

Further, in operation S321, a time section with identification information 'block2 text' may be set. In operation S322, the duration of the time section 'block2 text' may be set to 10 ms. In operation S323, red may be set as a color that corresponds to the time section 'block2 text'. In operation S324, a gradient pulse with identification information 'gradient_trapezoid_pulse_1' may be set. In operation S325, a flat top time of the gradient pulse 'gradient_trapezoid_pulse_1' may be set to 1 ms. In operation S326, a ramp time of the gradient pulse 'gradient_trapezoid_pulse_1' may be set to 1 ms. In operation S327, the amplitude of the gradient pulse 'gradient_trapezoid_pulse_1' may be set to 30 mT/m. In operation S328, the gradient pulse 'gradient_trapezoid_pulse_1' may be set as an X-axis gradient magnetic field that is generated in the time section 'block2 text'. In operation S329, the time section 'block2 text' may be set as a second time section of the MRI pulse sequence.

Accordingly, the pulse display apparatus 100 may generate an MRI pulse sequence that includes an RF pulse within a time section of about 0 ms to about 5 ms and an X-axis gradient pulse within a time section of about 5 ms to about 15 ms.

Referring to FIG. 3B, the pulse display apparatus 100 may display the generated MRI pulse sequence as an MRI pulse sequence schematic diagram 200.

The pulse display apparatus 100 may display a plurality of time axes 371 to 375 for showing an RF pulse sequence, X-axis, Y-axis, and Z-axis gradient pulse sequences, and an ADC pulse sequence with respect to an identical time scale.

The pulse display apparatus 100 may display a division line 350, which indicates a first time section 330, at a location of "5 ms" on a timeline. Further, the pulse display apparatus 100 may display a division line 360, which indicates a second time section 340, at a location of "15 ms" on the timeline. Still further, the pulse display apparatus 100 may display an RF pulse 335 of 3 ms duration in the first time section 330. In addition, the pulse display apparatus 100 may display a gradient pulse 345 having a flat top time of 1 ms, a ramp time of 1 ms, and an amplitude of 30 mT/m in the second time section 340.

Accordingly, the pulse display apparatus 100 may display the pulse sequence schematic diagram 200 that shows the MRI pulse sequence that is divided into a plurality of time sections.

Figure 4:
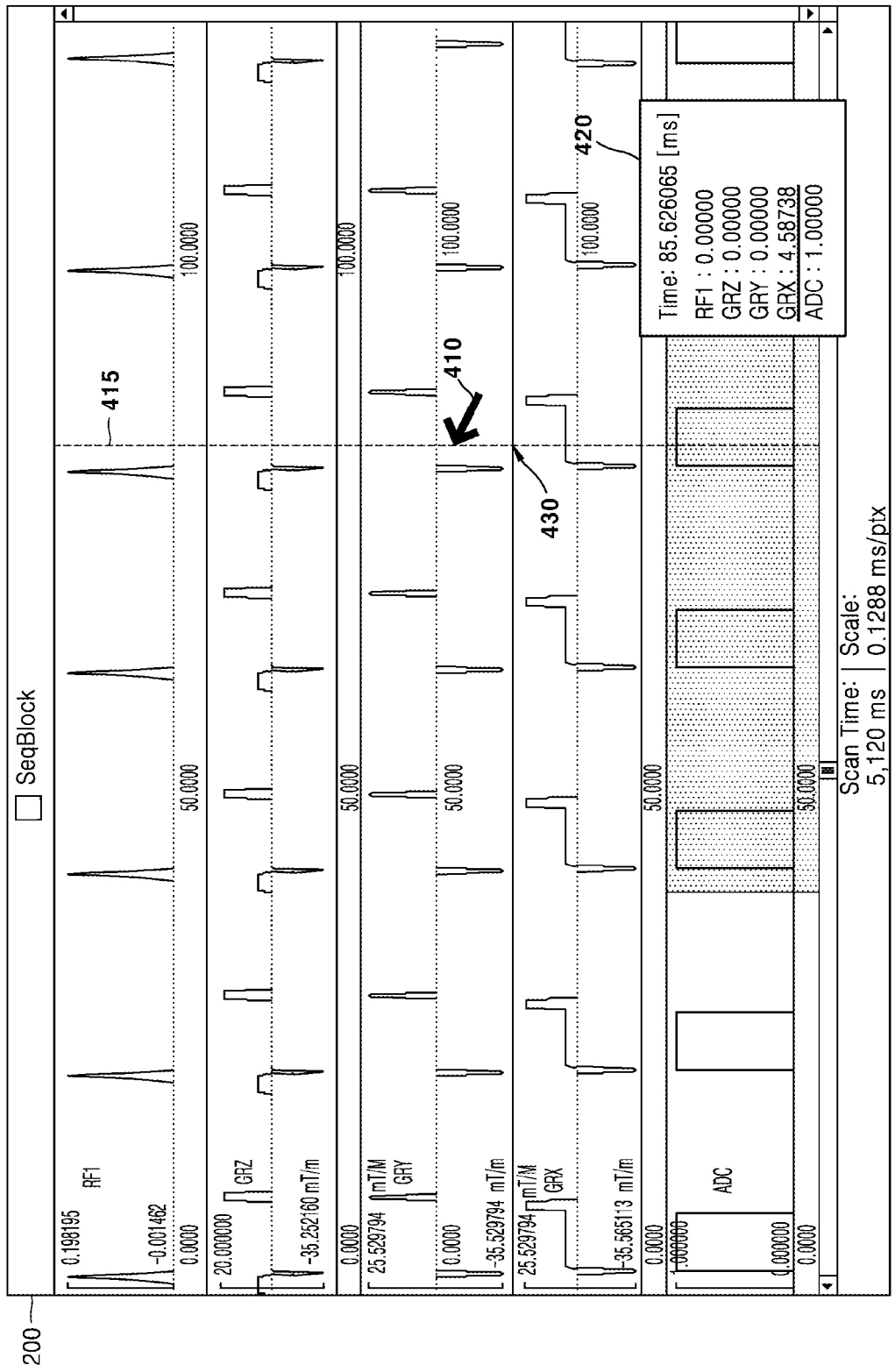
FIG. 4 is a diagram of a method for displaying information about an MRI pulse sequence, performed by a pulse display apparatus, according to an exemplary embodiment.

FIG. 4 is a diagram of a method for displaying information about an MRI pulse sequence, performed by the pulse display apparatus 100, according to an exemplary embodiment.

Referring to FIG. 4, the pulse display apparatus 100 may select a time point in the pulse sequence schematic diagram 200 according to a user input and display an image indicating the time point selected by the user on a location corresponding to the selected time point.

The pulse display apparatus 100 may display an image 415 that indicates a selected time point at a point 430 on a timeline where a cursor 410 is located.

Further, the pulse display apparatus 100 may determine a time point indicated by the cursor 410, and display information 420 about an MRI pulse generated at the determined time point on the pulse sequence schematic diagram 200.

For example, the pulse display apparatus 100 may receive a user input that relates to moving the cursor 410 on the pulse sequence schematic diagram 200. Further, the pulse display apparatus 100 may determine the point 430 on the timeline which corresponds to the time point indicated by the cursor 410, and determine a time point indicated by the determined point 430. When the time point indicated by the cursor 410 is determined, the pulse display apparatus 100 may extract the information 420 about the MRI pulse generated at the determined time point. When the time point indicated by the cursor 410 is 85.626065 ms, the pulse display apparatus 100 may determine that an amplitude of a Z-axis gradient pulse is 4.58738 mT/m and an amplitude of an ADC pulse is 1 at 85.626065 ms. The pulse display apparatus 100 may display the extracted information 420 about the MRI pulse on the pulse sequence schematic diagram 200. In this case, the pulse display apparatus 100 may display the extracted information 420 about the MRI pulse within a preset distance from a display location of the cursor 410.

When the user input that relates to moving the cursor 410 is received, according to the movement of the cursor 410, the pulse display apparatus 100 may move the image 415 that indicates the selected time point and the information 420 about the MRI pulse generated at the selected time point.

Figure 5A:
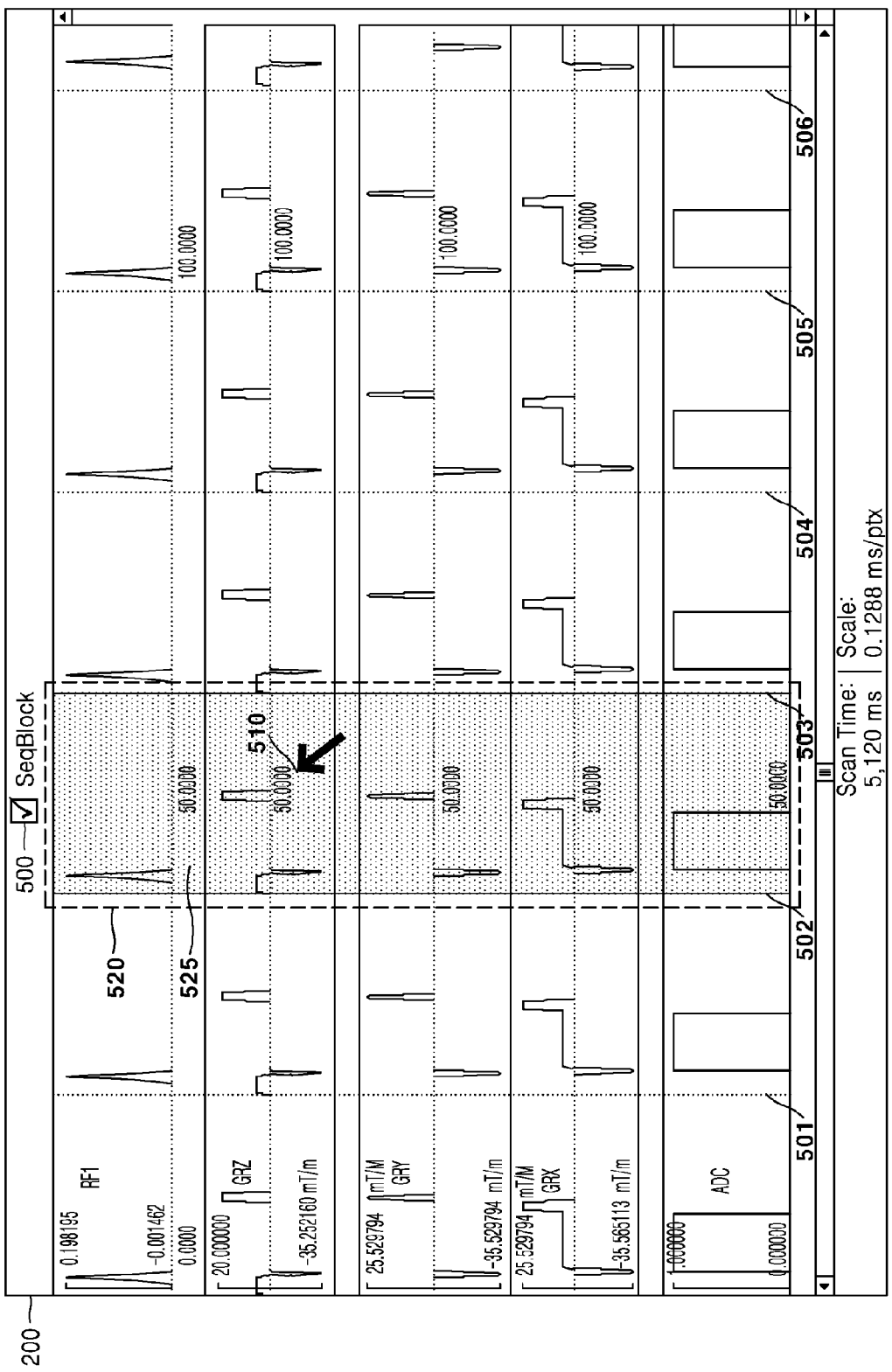
FIGS. 5A and 5B are diagrams of a user interface that is configured for selecting an area in a pulse sequence schematic diagram provided by a pulse display apparatus, according to an exemplary embodiment.
Figure 5B:
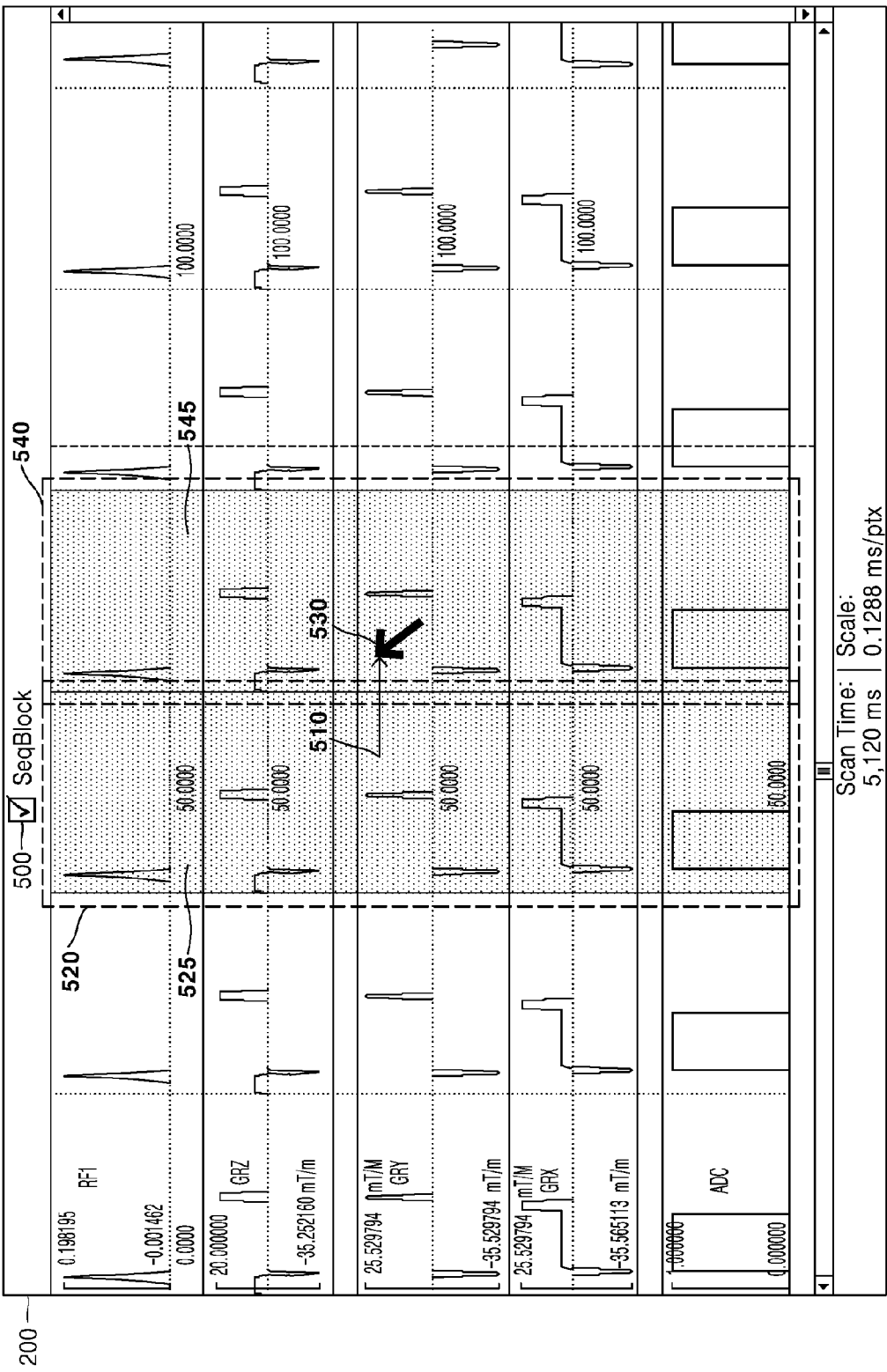

FIGS. 5A and 5B are diagrams of a user interface that is configured for selecting an area in the pulse sequence schematic diagram 200 provided by the pulse display apparatus 100, according to an exemplary embodiment.

Referring to FIG. 5A, the pulse display apparatus 100 may determine a selection area based on a user input that relates to selecting a point, and display the determined selection area as an area selected by the user.

The pulse display apparatus 100 may display a check box 500 for changing an interface mode to an area selecting mode. When a user input that relates to checking the check box 500 is received, the pulse display apparatus 100 may display division lines 501, 502, 503, 504, 505, and 506 that divide an MRI pulse sequence displayed on the pulse sequence schematic diagram 200 into a plurality of time sections. Further, when a user input that relates to unchecking the check box 500 is received, the pulse display apparatus 100 may delete the division lines 501 to 506 displayed on the pulse sequence schematic diagram 200.

Further, the pulse display apparatus 100 may receive a user input that relates to selecting a first point 510 in the pulse sequence schematic diagram 200. When the user input that relates to selecting the first point 510 is received, from among a plurality of areas that correspond to the plurality of time sections, the pulse display apparatus 100 may determine a first area 520 where the first point 510 is located as an area selected by the user. Still further, the pulse display apparatus 100 may display an image 525 that is usable for identifying the first area 520 on the first area 520.

Referring to FIG. 5B, the pulse display apparatus 100 may receive a user input that relates to dragging from the first point 510 to a second point 530 in a direction of a timeline of the pulse sequence schematic diagram 200. When the user input that relates to dragging from the first point 510 to the second point 530 is received, the pulse display apparatus 100 may determine whether the second point 530 is located in an area other than the first area 520 from among the plurality of areas that correspond to the plurality of time sections.

When the second point 530 is located in a second area 540 that is adjacent to the first area 520, the pulse display apparatus 100 may determine the first area 520 and the second area 540 as areas selected by the user. Further, the pulse display apparatus 100 may display an image 525 that is usable for identifying the first area 520 and an image 545 that is usable for identifying the second area 530 on the first area 520 and the second area 540, respectively.

Figure 6:
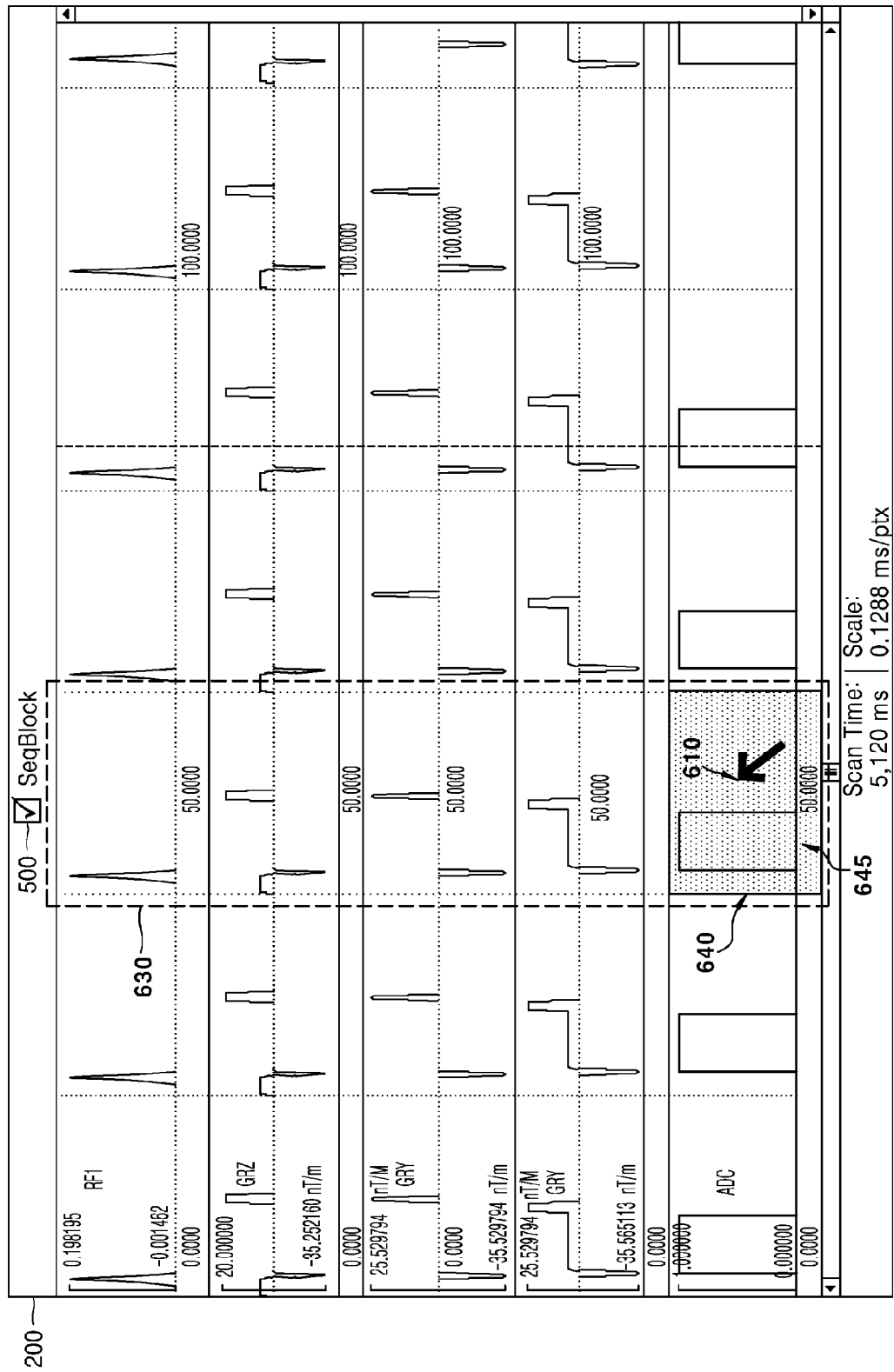
FIG. 6 is a diagram of a user interface that is configured for selecting an area in a pulse sequence schematic diagram provided by a pulse display apparatus, according to another exemplary embodiment.

FIG. 6 is a diagram of a user interface that is configured for selecting an area in the pulse sequence schematic diagram 200 provided by the pulse display apparatus 100, according to another exemplary embodiment.

Referring to FIG. 6, the pulse display apparatus 100 may determine a selection area related to a pulse sequence based on a user input that relates to selecting a point on the pulse sequence schematic diagram 200, and display the determined selection area as an area selected by the user.

The pulse display apparatus 100 may receive a user input that relates to selecting a first point 610 in the pulse sequence schematic diagram 200. When the user input that relates to selecting the first point 610 is received, the pulse display apparatus 100 may determine a portion of a first area 630 where the first point 610 is located as the area selected by the user. Further, the pulse display apparatus 100 may display an image that is usable for identifying the determined portion on the portion.

The portion may refer to an area that corresponds to a single pulse sequence. For example, from among a plurality of pulse sequences, the pulse display apparatus 100 may determine a pulse sequence that corresponds to the first point 610. For example, from among an RF pulse sequence, a plurality of gradient pulse sequences, and an ADC pulse sequence, the pulse display apparatus 100 may determine a pulse sequence that is displayed in an area where the first point 610 is located, based on a location of the first point 610. When the ADC pulse sequence is determined as the pulse sequence that is displayed in the area where the first point 610 is located, the pulse display apparatus 100 may determine a second area 640 that indicates the ADC pulse sequence from the first area 630 as the area selected by the user. When the second area 640 is determined as the area selected by the user, the pulse display apparatus 100 may display the image 645 that is usable for identifying the second area 640, on the second area 640.

Figure 7:
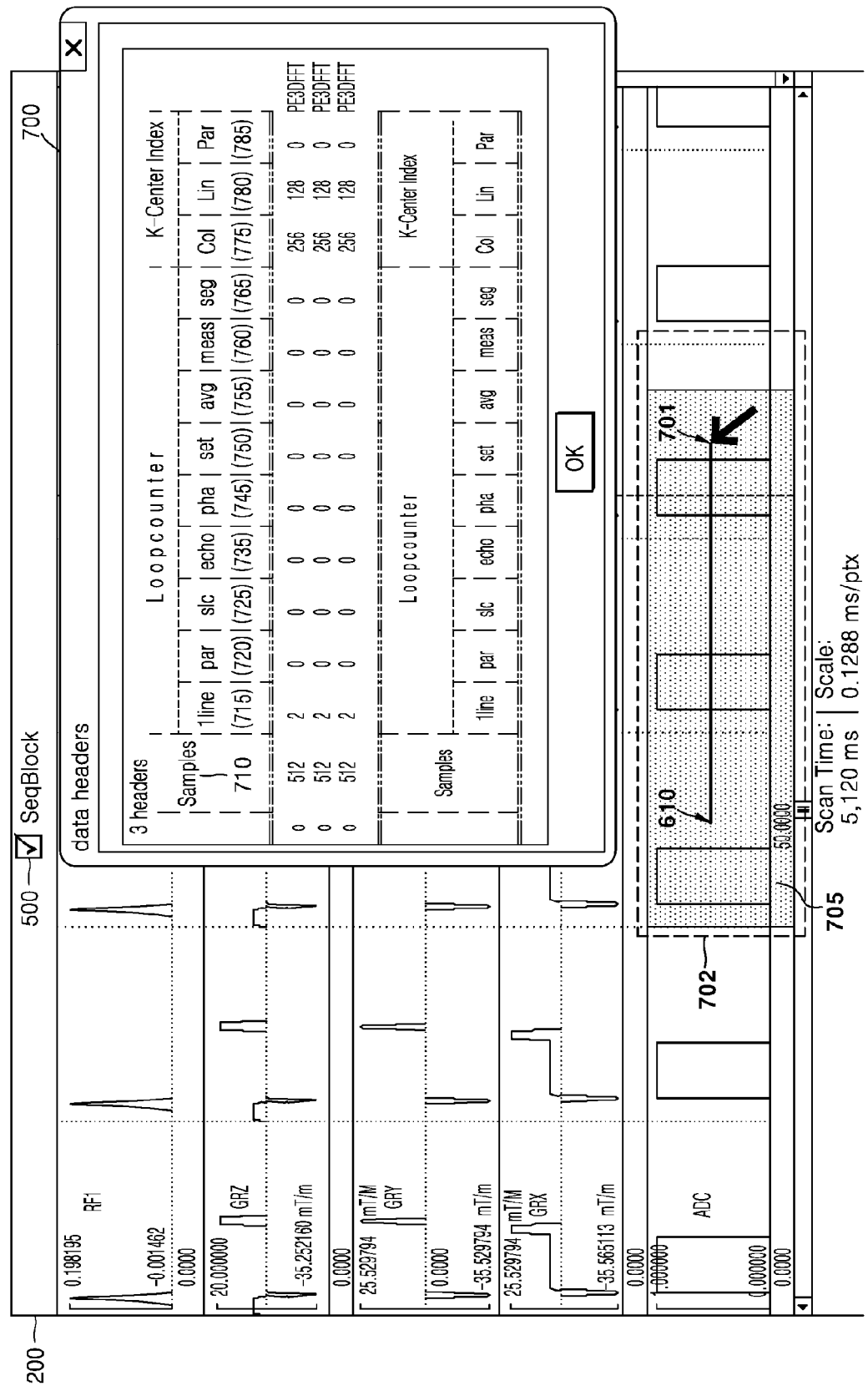
FIG. 7 is a diagram of a method for displaying information related to an MRI pulse sequence displayed on a selected area, performed by a pulse display apparatus, according to an exemplary embodiment.

FIG. 7 is a diagram of a method for displaying information related to an MRI pulse sequence displayed on a selected area, performed by the pulse display apparatus 100, according to an exemplary embodiment.

Referring to FIG. 7, the pulse display apparatus 100 may display information about an MRI pulse sequence displayed on a selected area.

The pulse display apparatus 100 may receive a user input that relates to dragging from the first point 610 to a second point 701 in an area where the ADC pulse sequence is displayed. When the user input is received, from among a plurality of areas that correspond to a plurality of time sections of the ADC pulse sequence, the pulse display apparatus 100 may determine an area 702 that includes points between the first point 610 and the second point 701 as an area selected by the user. The pulse display apparatus 100 may display an image 705 that is usable for identifying the selected area 702, on the area 702.

The pulse display apparatus 100 may receive a user input that relates to displaying information about an MRI pulse sequence displayed on the selected area 702. For example, the pulse display apparatus 100 may display a user interface that is configured for displaying the information about the MRI pulse sequence displayed on the selected area, receive a user input that relates to selecting the displayed user interface, and thus display the information about the MRI pulse sequence displayed on the selected area. Alternatively, the pulse display apparatus 100 may receive a user input that relates to pressing a certain key that is mapped to a function of displaying the information about the MRI pulse sequence displayed on the selected area, and display the information about the MRI pulse sequence displayed on the selected area.

When the user input that relates to displaying the information about the MRI pulse sequence displayed on the selected area, the pulse display apparatus 100 may display an identification window 700 that shows the information about the MRI pulse sequence displayed on the selected area.

On the identification window 700, the pulse display apparatus 100 may display information about the ADC pulse sequence that is displayed in the area 702 that indicates three time sections selected by the user. The information about the ADC pulse sequence may include RF data acquired from the object and information about signal processing related to the acquired RF data.

For example, on the identification window 700, the pulse display apparatus 100 may display the number of data samples (710), a line index of data (715), a partition index of data (720), a slice index of data (725), an echo index of data (735), a phase index of data (745), a set index of data (750), an average index of data (755), a measurement index of data (760), a segment index of data (765), a center column index of a K space line (775), a center line index of the K space line (780), and a center partition index of the K space line (785).

According to an exemplary embodiment, when an area in which an RF pulse or a gradient pulse is displayed is selected, the pulse display apparatus 100 may acquire information about the RF pulse or the gradient pulse displayed in the selected area as a parameter setting value related to an MRI pulse sequence. Further, the pulse display apparatus 100 may display the acquired information about the RF pulse or the gradient pulse.

Figure 8:
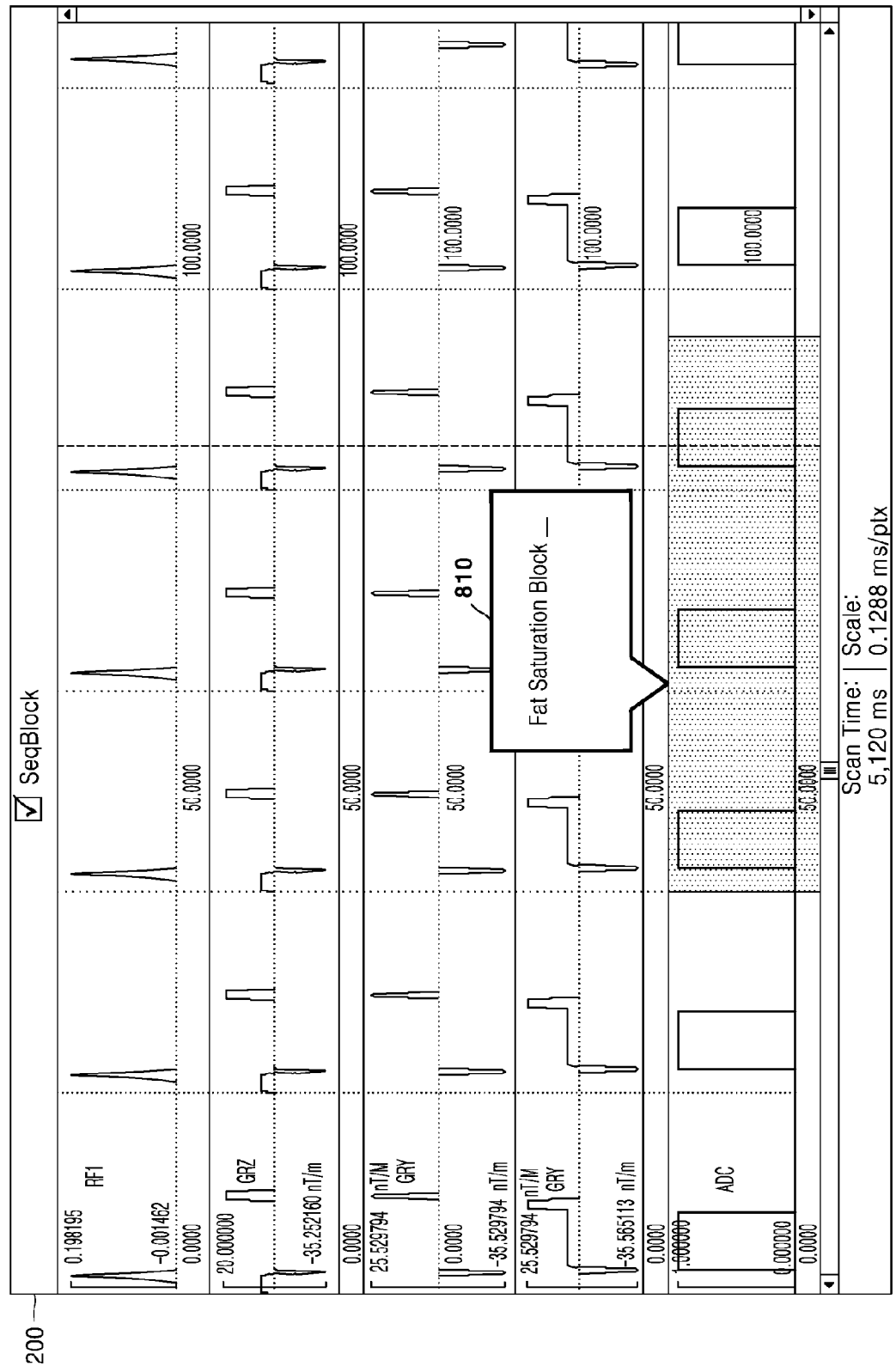
FIG. 8 is a diagram of a user interface that is configured for storing annotation information about a selected area provided by a pulse display apparatus, according to an exemplary embodiment.

FIG. 8 is a diagram of a user interface that is configured for storing annotation information about a selected area provided by the pulse display apparatus 100, according to an exemplary embodiment.

Referring to FIG. 8, the pulse display apparatus 100 may display an input window 810 configured to facilitate a user input that relates to annotation information about a selected area.

When an image that is usable for identifying the selected area is displayed, the pulse display apparatus 100 may display the input window 810 for facilitating the user input of the annotation information. Further, the pulse display apparatus 100 may display a button menu that relates to inputting the annotation information in the selected area, and when a user input that relates to selecting the displayed button menu is received, the pulse display apparatus 100 may display the input window 810 for inputting the annotation information. In addition, when the pulse display apparatus 100 receives a user input that relates to pressing a certain key that is mapped to a function of inputting the annotation information in the selected area, the pulse display apparatus 100 may display the input window 810 for inputting the annotation information.

The pulse display apparatus 100 may receive the user input that relates to inputting the annotation information that describes the selected area via the input window 810. When the user input that relates to inputting the annotation information is received, the pulse display apparatus 100 may display the annotation information on the input window 810.

The pulse display apparatus 100 may map the annotation information to a time section that corresponds to the selected area from among a plurality of time sections, and then store the mapped annotation information.

The pulse display apparatus 100 may receive a user input that relates to storing the annotation information. When the user input that relates to storing the annotation information is received, the pulse display apparatus 100 may determine the time section that corresponds to the selected area from among the plurality of time sections. The pulse display apparatus 100 may map the annotation information to the selected time section and store the mapped annotation information. In this case, the pulse display apparatus 100 may map the annotation information to not only the selected time section but also a selected pulse sequence, and then store the mapped annotation information. For example, the pulse display apparatus 100 may store the annotation information that corresponds to identification information of the selected time section. Alternatively, the pulse display apparatus 100 may store the annotation information that corresponds to the identification information of the selected time section and identification information of a pulse sequence.

Figure 9:
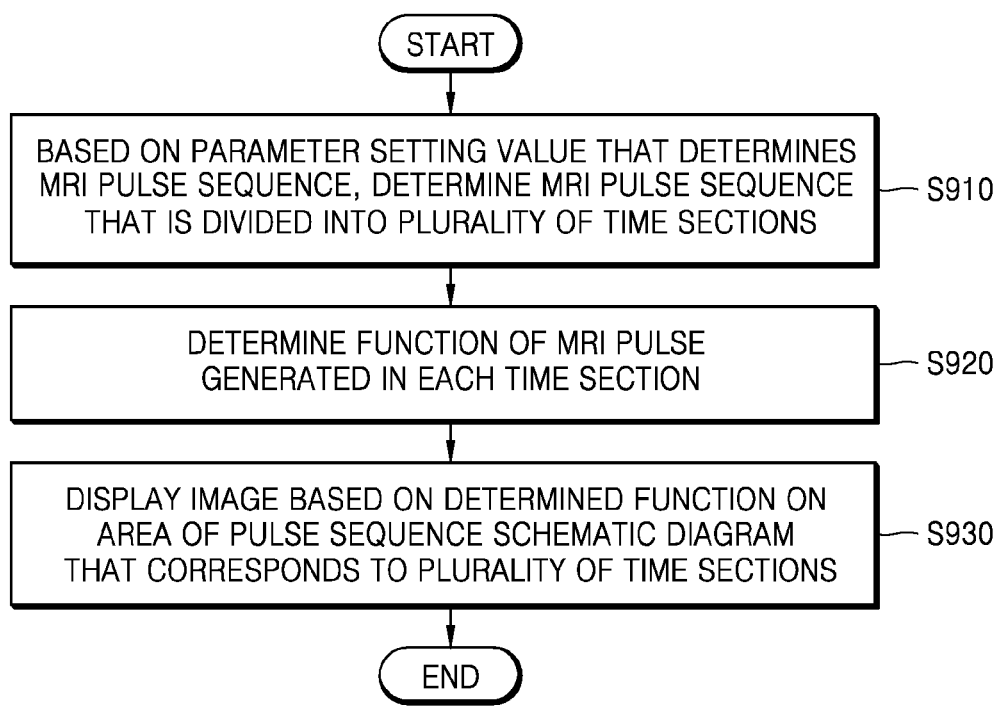
FIG. 9 is a flowchart of a method for distinguishing a plurality of areas that correspond respectively to a plurality of time sections, performed by a pulse display apparatus, according to an exemplary embodiment.

FIG. 9 is a flowchart of a method for distinguishing a plurality of areas that correspond to a plurality of time sections, performed by the pulse display apparatus 100, according to an exemplary embodiment.

In operation S910, the pulse display apparatus 100 may determine an MRI pulse sequence that is divided into a plurality of time sections based on a parameter setting value that is usable for determining an MRI pulse sequence.

The parameter setting value may include at least one selected from among time length information that relates to the plurality of time sections, order information that relates to the plurality of time sections, information about respective colors that correspond to the plurality of time sections, and information about MRI pulses generated in the plurality of time sections.

The pulse display apparatus 100 may determine the duration of a first time section based on time length information that relates to the first time section. Further, based on a parameter setting value related to an MRI pulse generated in the first time section, the pulse display apparatus 100 may determine a shape, amplitude, duration, and generation time of the MRI pulse generated in the first time section.

When the first time section is determined, the pulse display apparatus 100 may determine a second time section that follows the first time section based on the order information that relates to the plurality of time sections.

Accordingly, based on the parameter setting value, the pulse display apparatus 100 may determine the plurality of time sections and MRI pulses generated in the determined time sections, and thus generate the MRI pulse sequence that is divided into the plurality of time sections.

When the MRI pulse sequence is generated, the pulse display apparatus 100 may display the generated MRI pulse sequence along the timeline of the pulse sequence schematic diagram 200.

In operation S920, the pulse display apparatus 100 may determine a function of an MRI pulse generated in each of the plurality of time sections of the MRI pulse sequence.

The pulse display apparatus 100 may determine the function of the MRI pulse generated in each of the plurality of time sections based on a type, a shape, an amplitude, and a generation time of the MRI pulse generated in each of the plurality of time sections. For example, the pulse display apparatus 100 may determine a time section that includes only an RF pulse and a cross-section selection gradient pulse as a time section for exciting protons in a cross-section of an object. Further, the pulse display apparatus 100 may determine a time section that includes an ADC pulse as a time section for receiving an RF echo signal from the object. Still further, the pulse display apparatus 100 may determine a time section that does not include an MRI pulse as a time section for delaying time.

The pulse display apparatus 100 may determine the types of echo based on patterns generated by the MRI pulses in the MRI pulse sequence, and based on the determined types of the echo, determine the function of the MRI pulse generated in each of the plurality of time sections. The types of echo may include any of a spin echo, a turbo spin echo, a gradient echo, and an RF echo.

In operation S930, based on the determined function, the pulse display apparatus 100 may display an image on an area of the pulse sequence schematic diagram 200 which corresponds to a respective one of the plurality of time sections.

The pulse display apparatus 100 may display the pulse sequence schematic diagram 200 that shows the generated MRI pulse sequence. Further, when the functions of the MRI pulses generated in the plurality of time sections are determined, based on the determined functions, the pulse display apparatus 100 may display an image on an area of the pulse sequence schematic diagram 200 which corresponds to a respective one of the plurality of time sections.

For example, an image to be displayed on the pulse sequence schematic diagram 200 may be set with respect to a function of an MRI pulse. Accordingly, the pulse display apparatus 100 may determine a function of an MRI pulse generated in a certain time section, determine an image that corresponds to the determined function, and display the determined image on an area of the pulse sequence schematic diagram 200 which corresponds to the certain time section.

Figure 10:
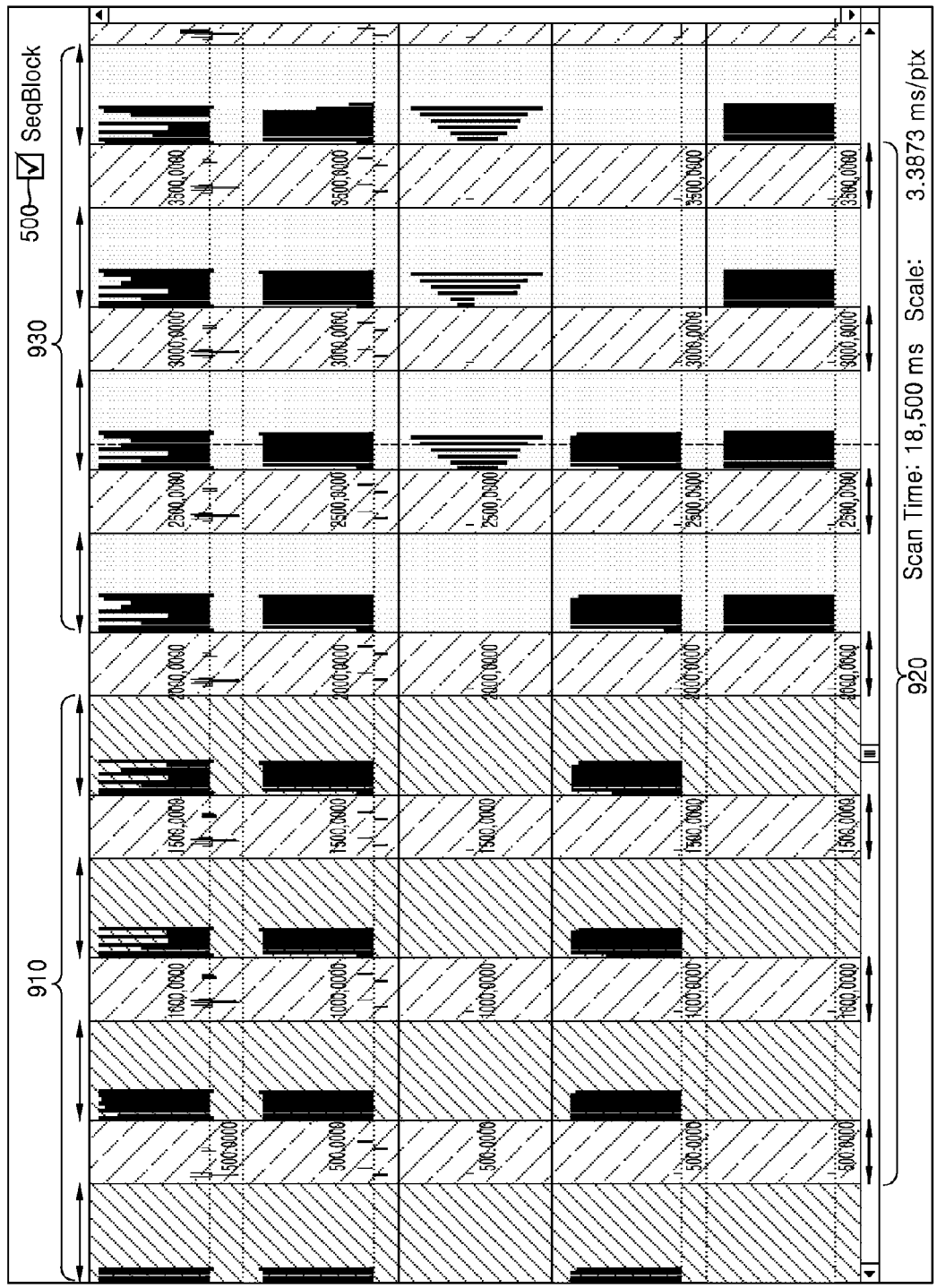
FIG. 10 is a diagram of a method for distinguishing a plurality of areas that correspond to a plurality of time sections, performed by a pulse display apparatus, according to an exemplary embodiment.

FIG. 10 is a diagram of a method for distinguishing a plurality of areas that correspond to a plurality of time sections, performed by the pulse display apparatus 100, according to an exemplary embodiment.

Referring FIG. 10, the pulse display apparatus 100 may distinguish a plurality of areas that correspond to a plurality of time sections by showing the plurality of areas in respective colors.

When displaying the pulse sequence schematic diagram 200, the pulse display apparatus 100 may distinguish a plurality of areas of the pulse sequence schematic diagram 200 by showing the plurality of areas in respective colors.

The pulse display apparatus 100 may display a button menu for displaying respective colors on the plurality of areas that correspond to the plurality of time sections, and when a user input that relates to selecting the button menu is received, the pulse display apparatus 100 may distinguish the plurality of areas by showing the plurality of areas in the respective colors.

Alternatively, the pulse display apparatus 100 may receive a user input that relates to changing a time scale of a timeline. When the user input that relates to changing the time scale is received, the pulse display apparatus 100 may distinguish the plurality of areas by showing the plurality of areas in respective colors. For example, when the user input that relates to changing the time scale is received, the pulse display apparatus 100 may adjust respective sizes of the plurality of areas that correspond to the plurality of time sections. Further, the pulse display apparatus 100 may display respective colors that are extracted from the plurality of areas on the plurality of areas with the adjusted sizes.

According to an exemplary embodiment, the pulse display apparatus 100 may distinguish the plurality of areas that correspond to the plurality of time sections by showing different colors according to respective functions of displayed MRI pulses.

Referring to FIG. 10, four first areas 910 may correspond to a time section for exciting protons in a cross-section of an object. Further, seven second areas 920 may correspond to a time section for delaying time. Still further, four third areas 930 may correspond to a time section for receiving RF echo data from the object. The pulse display apparatus 100 may determine a function of each time section, and according to the determined functions, display an identical image on time sections having an identical function. Thus, the plurality of time sections may be distinguished according to the functions thereof.

According to another exemplary embodiment, the pulse display apparatus 100 may show respective colors on the plurality of areas based on information about the respective colors that corresponds to the plurality of time sections.

For example, the pulse display apparatus 100 may acquire information about respective colors corresponding to the plurality of time sections. The information about the respective colors corresponding to the plurality of time sections may be set based on a parameter setting value related to an MRI pulse sequence. When the information about the respective colors corresponding to the plurality of time sections is acquired, the pulse display apparatus 100 may extract respective colors that correspond to the plurality of areas based on the information about the respective colors that correspond to the plurality of time sections. The pulse display apparatus 100 may display the respective colors that are extracted with respect to the plurality of areas on the plurality of areas. Accordingly, the plurality of areas may be distinguished by the respective colors that are set by the user.

Figure 11:
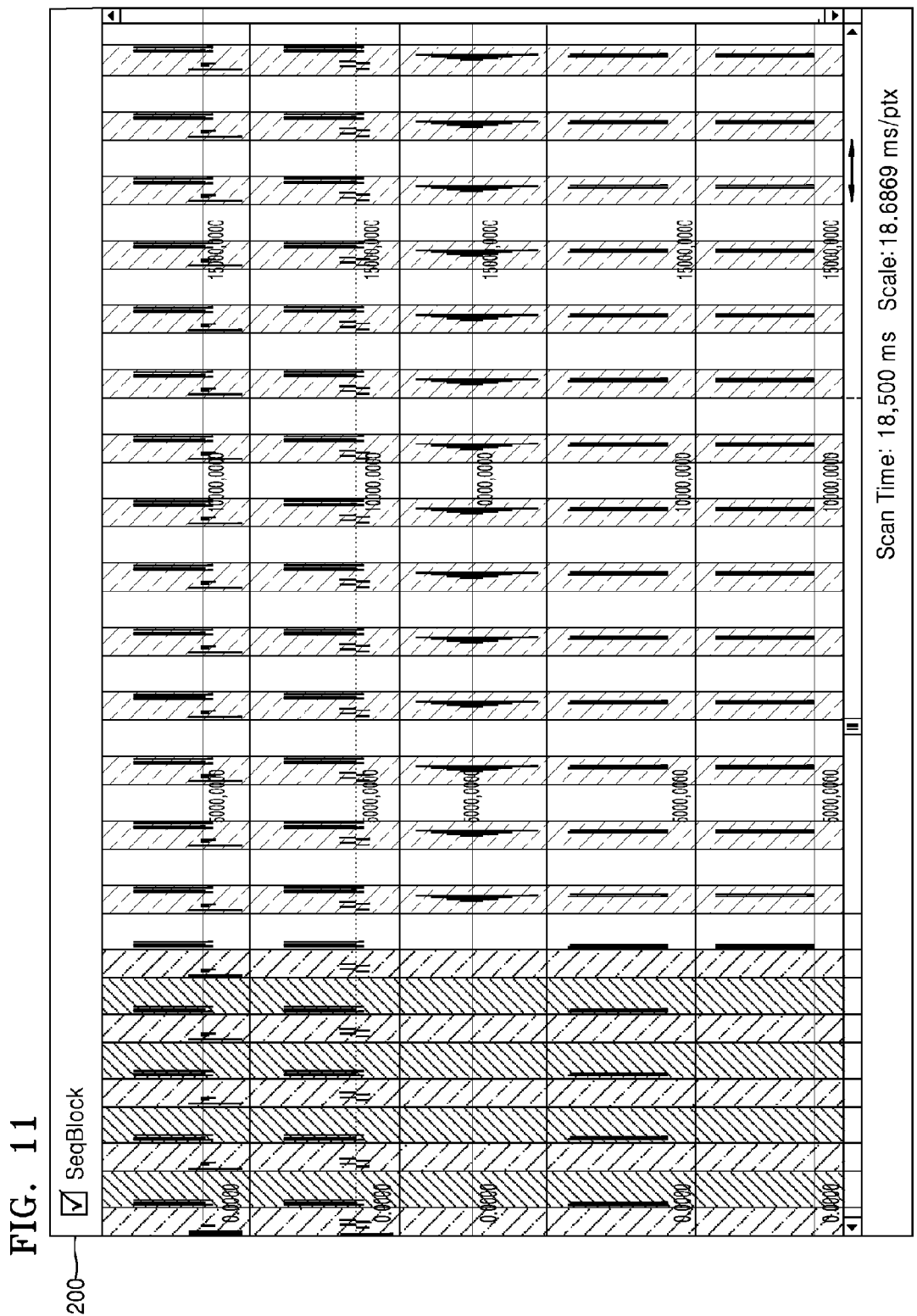
FIG. 11 is a diagram of a method for distinguishing a plurality of areas that correspond to a plurality of time sections according to time scales of a pulse sequence schematic diagram, performed by a pulse display apparatus, according to an exemplary embodiment.

FIG. 11 is a diagram of a method for distinguishing a plurality of areas that correspond to a plurality of time sections according to time scales of the pulse sequence schematic diagram 200, performed by the pulse display apparatus 100, according to an exemplary embodiment.

Referring to FIG. 11, the pulse display apparatus 100 may adjust respective sizes of a plurality of areas that correspond to a plurality of time sections according to a time scale of the pulse sequence schematic diagram 200, and distinguish the plurality of areas based on the adjusted sizes.

The pulse display apparatus 100 may receive a user input that relates to increasing the time scale of the pulse sequence schematic diagram 200. For example, the pulse display apparatus 100 may receive a user input that relates to increasing the time scale from 3.8373 ms/ptx to 18.6869 ms/ptx.

When the user input that relates to increasing the time scale is received, the pulse display apparatus 100 may increase a time length that corresponds to a length unit of a timeline of the pulse sequence schematic diagram 200. When the time length is increased, the pulse display apparatus 100 may reduce respective widths of the plurality of areas that correspond to the plurality of time sections. Further, the pulse display apparatus 100 may adjust an image displayed on the plurality of areas according to the respective widths of the plurality of areas.

Therefore, even when a shape of an MRI pulse may not be recognized due to an increase in a time scale, the user may identify a function of a time section based on respective colors that correspond to a plurality of time sections that divide an MRI pulse sequence.

Figure 12:
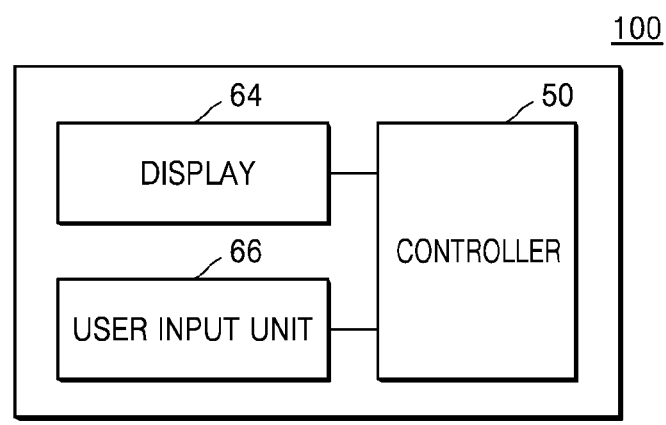
FIG. 12 is a block diagram illustrating a pulse display apparatus according to an exemplary embodiment.

FIG. 12 is a block diagram illustrating the pulse display apparatus 100 according to an exemplary embodiment.

Referring to FIG. 12, the pulse display apparatus 100 may include a display 64, a user input unit (also referred to herein as a "user input device") 66, and a controller 50. However, it is not necessary to include all of the illustrated components, and more or less components than the ones shown in FIG. 12 may be included in the pulse display apparatus 100.

The pulse display apparatus 100 may include operate in conjunction with an MRI apparatus that is configured for capturing MR images. Alternatively, the pulse display apparatus 100 may include any or a picture archiving and communication system (PACS) viewer, a smart phone, a laptop computer, a personal digital assistant (PDA), and/or a tablet personal computer (PC), but is not limited thereto.

The display 64 may display any of various types of information that relates to displaying MRI pulses.

The display 64 may display any of an MRI pulse sequence, a pulse sequence schematic diagram, and/or error information.

The display 64 may display the MRI pulse sequence along a timeline of the pulse sequence schematic diagram.

The display 64 may display a division line that distinguishes a plurality of time sections on a pulse sequence schematic diagram.

The display 64 may display respective colors extracted with respect to a plurality of areas that correspond to the plurality of time sections in the pulse sequence schematic diagram, on the plurality of areas.

The display 64 may adjust respective sizes of the plurality of areas that correspond to the plurality of time sections, and display the respective colors extracted with respect to the plurality of areas on the plurality of areas with adjusted sizes.

The display 64 may display information that is related to an MRI pulse, which is displayed in an area selected by the user, from among a plurality of MRI pulses included in the MRI pulse sequence.

The display 64 may display an input window that facilitates a user input of annotation information related to the area selected by the user.

The user input unit 66 may receive various user inputs that relate to displaying the plurality of MRI pulses. Further, the user input unit 66 may receive various user inputs that relate to manipulating a displayed user interface.

The user input unit 66 may receive a user input that relates to selecting a point on the displayed pulse sequence schematic diagram.

The user input unit 66 may receive a user input that relates to changing a time scale of a timeline.

The user input unit 66 may receive a user input that relates to dragging along a direction of the timeline of the pulse sequence schematic diagram.

The user input unit 66 may receive a user input that relates to inputting annotation information about the area selected by the user.

The controller 50 may control components in the pulse display apparatus 100, for example, the user input unit 66 and the display 64.

The controller 50 may control the display 64 such that the display 64 displays, on an image that is usable for identifying an area where a selected point is located from among the plurality of areas corresponding to the plurality of time sections, an image that is usable for identifying the area where the selected point is located.

The controller 50 may acquire the plurality of time sections and a parameter setting value that is usable for determining MRI pulses generated in the plurality of time sections, and based on the parameter setting value, may generate the MRI pulse sequence that is divided into the plurality of time sections.

Figure 13:
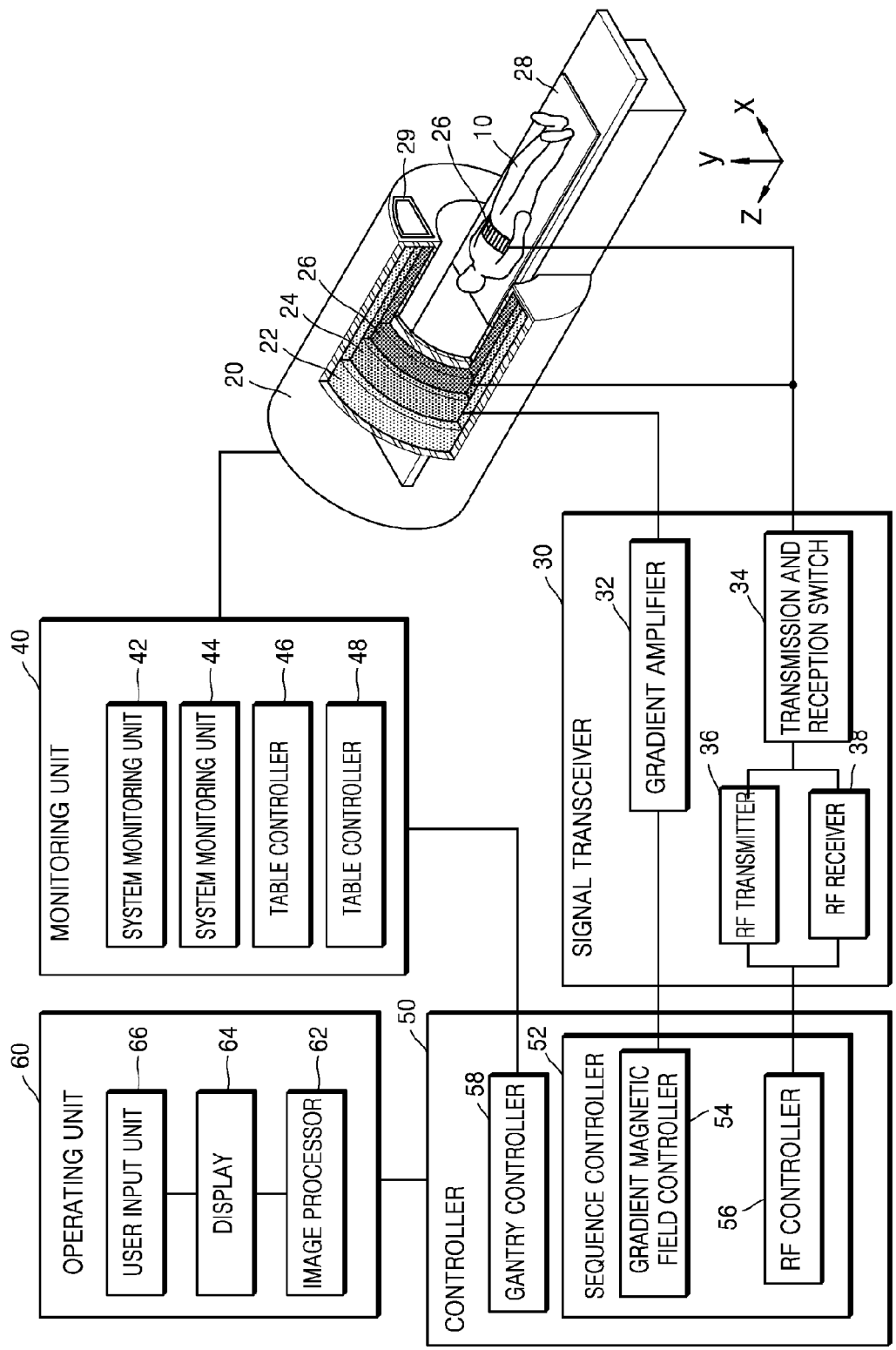
FIG. 13 is a block diagram illustrating a pulse display apparatus according to another exemplary embodiment.

FIG. 13 is a block diagram illustrating the pulse display apparatus 100 according to another exemplary embodiment.

Referring to FIG. 13, the pulse display apparatus 100 may include a gantry 20, a signal transceiver 30, a monitoring unit (also referred to herein as a "monitor") 40, a controller 50, and an operating unit (also referred to herein as a "user workstation") 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction with respect to the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils configured for generating gradient magnetic fields in X-axis, Y-axis, and Z-axis directions that cross each other at right angles (i.e., directions that are mutually orthogonal). The gradient coil 24 may provide location information that relates to each region of the object 10 by variably inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal that has the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal which corresponds to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves that have a Larmor frequency. In this aspect, when the applying of the electromagnetic wave signal to the atomic nucleus is stopped, an energy level of the atomic nucleus is changed from a high energy level to a low energy level, and thus the atomic nucleus may emit electromagnetic waves that have a Larmor frequency. The RF coil 26 may receive electromagnetic wave signals from atomic nuclei included in the object 10.

The RF coil 26 may be realized as one RF transmitting and receiving coil that has both a function of generating electromagnetic waves, each of which has an RF that corresponds to a type of an atomic nucleus, and a function of receiving electromagnetic waves emitted from an atomic nucleus. Alternatively, the RF coil 26 may be realized as a transmission RF coil that has a function of generating electromagnetic waves, each of which has an RF that corresponds to a type of an atomic nucleus, and a reception RF coil that has a function of receiving electromagnetic waves emitted from an atomic nucleus.

The RF coil 26 may be fixed to the gantry 20 or may be detachable. When the RF coil 26 is detachable, the RF coil 26 may be an RF coil that is configured for a specific part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may communicate with an external apparatus via wires and/or wirelessly, and may also perform dual tune communication according to a communication frequency band.

The RF coil 26 may include any of a transmission exclusive coil, a reception exclusive coil, or a transmission and reception coil according to methods of transmitting and receiving an RF signal.

The RF coil 26 may include an RF coil that has any of various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 via the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-axis, Y-axis, and Z-axis directions may be synthesized.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 via the RF coil 26 during a transmission mode, and receive the MR signal from the object 10 via the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor and control any one or more of a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera configured for observing a movement or position of the object 10, a respiration measurer configured for measuring the respiration of the object 10, an electrocardiogram (ECG) measurer configured for measuring the electrical activity of the object 10, and/or a temperature measurer configured for measuring a temperature of the object 10.

The table controller 46 controls a movement of the table 28 where the object 10 is positioned. The table controller 46 may control the movement of the table 28 according to a sequence control of the controller 50. For example, during moving imaging of the object 10, the table controller 46 may continuously or discontinuously move the table 28 according to the sequence control of the controller 50, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Further, when a speaker is located inside or outside the gantry 20, the display controller 48 may control the speaker to be on or off, or may control sound to be output via the speaker.

The controller 50 may include a sequence controller 52 configured for controlling a sequence of signals formed in the gantry 20, and a gantry controller 58 configured for controlling the gantry 20 and the devices mounted on the gantry 20.

The sequence controller 52 may include the gradient magnetic field controller 54 configured for controlling the gradient amplifier 32, and the RF controller 56 configured for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. In this aspect, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the controller 50 to transmit pulse sequence information while controlling an overall operation of the MRI system.

The operating unit 60 may include an image processor 62 configured for receiving and processing the MR signal received by the RF receiver 38, a display 64, and a user input unit 66.

The image processor 62 may process the MR signal received from the RF receiver 38 so as to generate MR image data that relates to the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

The image processor 62 may perform a composition process or difference calculation process on image data if required. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The display 64 may output image data generated or rearranged by the image processor 62 to the user. The display 64 may also output information required for the user to manipulate the MRI system, such as a user interface (UI), user information, or object information. The display 64 may include any one or more of a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, and/or any one of other various output devices that are well known to one of ordinary skill in the art.

The user may input object information, parameter information, a scan condition, a pulse sequence, and/or information about image composition or difference calculation by using the user input unit 66. The user input unit 66 may include any one or more of a keyboard, a mouse, a track ball, a voice recognizer, a gesture recognizer, a touch screen, or any one of other various input devices that are well known to one of ordinary skill in the art.

The signal transceiver 30, the monitoring unit 40, the controller 50, and the operating unit 60 are separate components in FIG. 13, but it will be apparent to one of ordinary skill in the art that respective functions of the signal transceiver 30, the monitoring unit 40, the controller 50, and the operating unit 60 may be performed by another component. For example, the image processor 62 converts the MR signal received from the RF receiver 38 into a digital signal in FIG. 13, but alternatively, the conversion of the MR signal into the digital signal may be performed by the RF receiver 38 or the RF coil 26.

The gantry 20, the RF coil 26, the signal transceiver 30, the monitoring unit 40, the controller 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the controller 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

One or more exemplary embodiments can be implemented by using computer-readable code/instructions, such as a computer-executed program module, stored in/on a medium, e.g., a computer-readable medium. The computer-readable medium may be a random computer-accessible medium, and may include volatile media, non-volatile media, separable media and/or non-separable media. Further, the computer-readable medium may correspond to any computer storage media and communication media. The computer storage media includes volatile media, non-volatile media, separable media and/or non-separable media which are implemented by using a method or technology for storing information, such as computer-readable code/instructions, data structures, program modules, or other data. The communication media generally includes computer-readable code/instructions, data structures, program modules, or other transmission mechanisms, and random information transmission media.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments. For example, a single element may be separately implemented, and separate elements may be implemented in a combined form.

While one or more exemplary embodiments have been described with reference to the figures, it will be understood by those of ordinary skill in the art that various changes in form and details may be made therein without departing from the spirit and scope as defined by the following claims.

What is claimed is:

1. A pulse display apparatus comprising:
a user input device configured to receive a user input for inputting a plurality of time sections and magnetic resonance imaging (MRI) pulses to be generated in each of the plurality of time sections;
a display configured to display a pulse sequence schematic diagram that shows an MRI pulse sequence along a timeline that is divided into the plurality of time sections based on the plurality of time sections and the MRI pulses to be generated in each of the plurality of time sections;
wherein the user input device is further configured to receive a user input that relates to selecting a first point on the pulse sequence schematic diagram; and
a processor configured to determine a time section from among the plurality of time sections and a first area corresponding to the determined time section in the pulse sequence schematic diagram based on coordinates of the selected first point, and control the display to identify the determined time section from among the plurality of time sections by displaying an image representing the first area on the first area.

2. The apparatus of claim 1, wherein the processor is further configured to acquire a parameter setting value that is usable for determining the plurality of time sections and the MRI pulses generated in the plurality of time sections, and, based on the parameter setting value, to generate the MRI pulse sequence, and
the display is further configured to display the MRI pulse sequence along the timeline.

3. The apparatus of claim 2, wherein the parameter setting value comprises at least one selected from among time length information that relates to the plurality of time sections, order information that relates to the plurality of time sections, information about respective colors that correspond to the plurality of time sections, and information about the MRI pulses generated in the plurality of time sections.

4. The apparatus of claim 3, wherein the processor is further configured to extract respective colors that correspond to the plurality of areas based on the information about the respective colors that correspond to the plurality of time sections, and
the display is further configured to display the extracted respective colors on the plurality of areas.

5. The apparatus of claim 4, wherein the user input device is further configured to receive a user input that relates to changing a time scale of the timeline, and
when the user input that relates to changing the time scale is received, the display is further configured to adjust respective sizes of the plurality of areas that correspond to the plurality of time sections and to display the extracted respective colors with the adjusted sizes.

6. The apparatus of claim 1, wherein the display is further configured to display a division line for dividing the plurality of time sections on the pulse sequence schematic diagram.

7. The apparatus of claim 1, wherein the MRI pulse sequence comprises a plurality of pulse sequences,
the processor is further configured to determine a pulse sequence that corresponds to the first point from among the plurality of pulse sequences, and to determine a second area that corresponds to the determined pulse sequence from the first area, and the display is further configured to display an image that is usable for identifying the second area on the second area.

8. The apparatus of claim 1, wherein the user input device is further configured to receive a user input that relates to dragging from the first point in a direction of the timeline of the pulse sequence schematic diagram,
based on the user input that relates to the dragging, the processor is further configured to determine at least two areas that include at least a part of the first area where the first point is located, and
the display is configured to display a respective image that is usable for identifying a corresponding one of the at least two areas on each of the at least two areas.

9. The apparatus of claim 1, wherein the display is further configured to display information about an MRI pulse displayed in the first area from among a plurality of MRI pulses that form the MRI pulse sequence.

10. The apparatus of claim 1, wherein when the image that is usable for identifying the first area is displayed, the display is further configured to display an input window that relates to inputting annotation information,
the user input device is further configured to receive a user input that relates to inputting annotation information that describes the first area, via the input window, and
the processor is further configured to map the inputted annotation information to a time section that corresponds to the first area from among the plurality of time sections, and then to store the mapped annotation information.

11. The apparatus of claim 1, wherein the user input device is further configured to receive a user input that relates to selecting a mode from among an area selecting mode and an interface mode, and
wherein when the area selecting mode is selected, the processor is further configured to control the display to display division lines that correspond to the plurality of time sections, and when the interface mode is selected, the processor is further configured to control the display to not display the division lines.

12. A pulse sequence display method comprising:
receiving a user input for inputting a plurality of time sections and magnetic resonance imaging (MRI) pulses to be generated in each of the plurality of time sections;
displaying a pulse sequence schematic diagram that shows an MRI pulse sequence along a timeline that is divided into the plurality of time sections based on the plurality of time sections and the MRI pulses to be generated in each of the plurality of time sections;
receiving a user input that relates to selecting a first point on the pulse sequence schematic diagram;
determining a time section from among the plurality of time sections and a first area corresponding to the determined time section in the pulse sequence schematic diagram based on coordinates of the selected first point; and
controlling the display to identify the determined time section from among the plurality of time sections by displaying an image representing the first area on the first area.

13. The method of claim 12, wherein the displaying the pulse sequence schematic diagram comprises:
acquiring a parameter setting value that is usable for determining the plurality of time sections and the MRI pulses generated in the plurality of time sections;
generating, based on the parameter setting value, the MRI pulse sequence; and
displaying the MRI pulse sequence along the timeline.

14. The method of claim 13, wherein the parameter setting value comprises at least one selected from among time length information that relates to the plurality of time sections, order information that relates to the plurality of time sections, information about respective colors that correspond to the plurality of time sections, and information about the MRI pulses generated in the plurality of time sections.

15. The method of claim 14, further comprising:
extracting respective colors that correspond to the plurality of areas based on the information about the respective colors that correspond to the plurality of time sections; and
displaying the extracted respective colors on the plurality of areas.

16. The method of claim 15, wherein the displaying the extracted respective colors on the plurality of areas comprises:
receiving a user input that relates to changing a time scale of the timeline;
adjusting respective sizes of the plurality of areas that correspond to the plurality of time sections; and
displaying the extracted respective colors with the adjusted sizes.

17. The method of claim 12, wherein the displaying the pulse sequence schematic diagram comprises displaying a division line for dividing the plurality of time sections on the pulse sequence schematic diagram.

18. The method of claim 12, wherein the MRI pulse sequence comprises a plurality of pulse sequences, and
the displaying the image that is usable for identifying the first area comprises:
determining a pulse sequence that corresponds to the first point from among the plurality of pulse sequences;
determining a second area that corresponds to the determined pulse sequence from the first area; and
displaying an image that is usable for identifying the second area on the second area.

19. The method of claim 12, further comprising:
receiving a user input that relates to dragging from the first point in a direction of the timeline of the pulse sequence schematic diagram;
determining, based on the user input that relates to the dragging, at least two areas that include at least a part of the first area where the first point is located; and
displaying a respective image that is usable for identifying a corresponding one of the at least two areas on each of the at least two areas.

20. The method of claim 12, further comprising displaying information about an MRI pulse displayed in the first area from among a plurality of MRI pulses that form the MRI pulse sequence.

21. The method of claim 12, further comprising:
displaying, when the image that is usable for identifying the first area is displayed, an input window that relates to inputting annotation information;
receiving, via the input window, a user input that relates to inputting annotation information that describes the first area; and
mapping the inputted annotation information to a time section that corresponds to the first area from among the plurality of time sections, and then storing the mapped annotation information.

* * * * *